(12) United States Patent
Yamazaki et al.

(10) Patent No.: US 8,653,520 B2
(45) Date of Patent: Feb. 18, 2014

(54) SEMICONDUCTOR DEVICE AND METHOD FOR MANUFACTURING THE SAME

(75) Inventors: Shunpei Yamazaki, Tokyo (JP); Teruyuki Fujii, Kanagawa (JP); Ryota Imahayashi, Fukuoka (JP); Shinya Sasagawa, Kanagawa (JP); Motomu Kurata, Kanagawa (JP); Fumika Taguchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 395 days.

(21) Appl. No.: 13/021,343

(22) Filed: Feb. 4, 2011

(65) Prior Publication Data

US 2012/0074407 A1 Mar. 29, 2012

(30) Foreign Application Priority Data

Feb. 12, 2010 (JP) ................................. 2010-029278

(51) Int. Cl.
*H01L 29/04* (2006.01)
*H01L 29/10* (2006.01)
*H01L 31/00* (2006.01)
*H01L 21/00* (2006.01)
*H01L 21/84* (2006.01)

(52) U.S. Cl.
USPC ........................................... 257/57; 438/152

(58) Field of Classification Search
USPC ........................................... 257/57; 438/152
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 5,940,705 A | 8/1999 | Lee et al. |
| 6,018,195 A | 1/2000 | Takebuchi |

(Continued)

FOREIGN PATENT DOCUMENTS

| EP | 1737044 A | 12/2006 |
| EP | 2061087 A | 5/2009 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Matthew Landau
*Assistant Examiner* — Igwe U Anya
(74) *Attorney, Agent, or Firm* — Eric J. Robinson; Robinson Intellectual Property Law Office, P.C.

(57) ABSTRACT

An object is to provide a semiconductor device having a novel structure in which a transistor including an oxide semiconductor and a transistor including a semiconductor material other than an oxide semiconductor are stacked. The semiconductor device includes a first transistor, an insulating layer over the first transistor, and a second transistor over the insulating layer. In the semiconductor device, the first transistor includes a first channel formation region, the second transistor includes a second channel formation region, the first channel formation region includes a semiconductor material different from a semiconductor material of the second channel formation region, and the insulating layer includes a surface whose root-mean-square surface roughness is less than or equal to 1 nm.

21 Claims, 22 Drawing Sheets

(56) References Cited

U.S. PATENT DOCUMENTS

| | | | |
|---|---|---|---|
| 6,127,702 A | 10/2000 | Yamazaki et al. | |
| 6,294,274 B1 | 9/2001 | Kawazoe et al. | |
| 6,515,511 B2 | 2/2003 | Sugibayashi et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,678,625 B2 | 3/2010 | Lim et al. | |
| 7,732,819 B2 | 6/2010 | Akimoto et al. | |
| 8,207,025 B2 * | 6/2012 | Suzawa et al. | 438/151 |
| 2001/0015450 A1 | 8/2001 | Sugibayashi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0160726 A1 | 7/2008 | Lim et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0127551 A1 | 5/2009 | Imai | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0215317 A1 * | 9/2011 | Yamazaki et al. | 257/43 |
| 2011/0215326 A1 * | 9/2011 | Godo et al. | 257/57 |
| 2011/0220891 A1 * | 9/2011 | Fujii et al. | 257/57 |

FOREIGN PATENT DOCUMENTS

| | | |
|---|---|---|
| EP | 2226847 A | 9/2010 |
| JP | 60-198861 A | 10/1985 |
| JP | 63-040343 A | 2/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-193188 A | 7/1995 |
| JP | 08-264794 A | 10/1996 |
| JP | 09-283751 A | 10/1997 |
| JP | 10-209389 A | 8/1998 |
| JP | 11-505377 | 5/1999 |
| JP | 11-233789 | 8/1999 |
| JP | 11-233789 A | 8/1999 |
| JP | 2000-044236 A | 2/2000 |
| JP | 2000-150900 A | 5/2000 |
| JP | 2001-230326 A | 8/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-220816 | 8/2007 |
| JP | 2007-220816 A | 8/2007 |
| JP | 2008-166802 A | 7/2008 |
| JP | 2009-141342 A | 6/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O Tfts,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Eletron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Raper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) For AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Digest of Technical Papers, 2007, vol. 38, pp. 1803-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "Spinel,YBFE2O4, and YB2FE3O7 Types of Structures for Compounds in the In2O3 and SC2O3—A2O3—BO Systems [A; Fe, Ga, Or, Al; B: Mg, Mn, Fe, Ni, Cu,Or, Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 2, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nakamura. M et al., "Homologous Series, Synthesis and Crystal Structure of InFeO3(ZnO)m (m: natural number) and its Isostructural Compound", Kotai Butsuri (Solid State Physics), 1993, vol. 28, No. 5, pp. 317-327.

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

International Search Report (Application No. PCT/JP2011/050791), Dated Apr. 12, 2011.

Written Opinion (Application No. PCT/JP2011/050791), Dated Apr. 12, 2011.

* cited by examiner

FIG. 15A
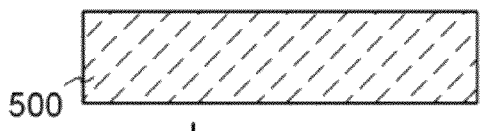
FIG. 15B
FIG. 15C
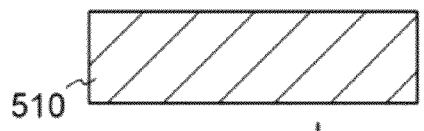
FIG. 15D
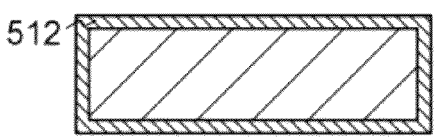
FIG. 15E
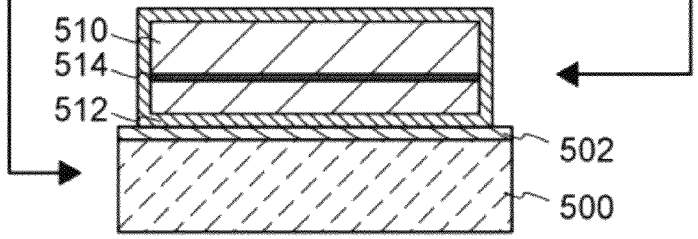
FIG. 15F
FIG. 15G
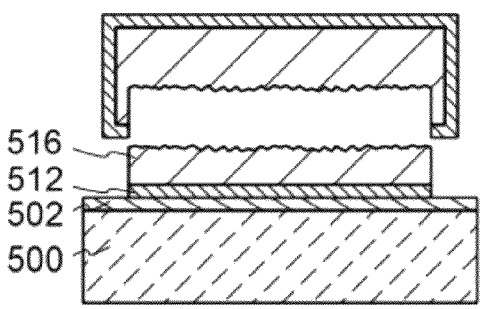
FIG. 15H
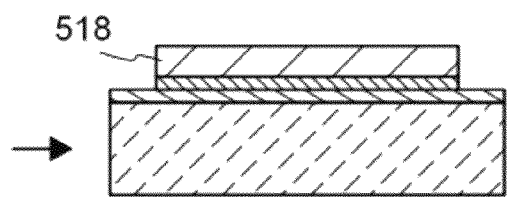

SEMICONDUCTOR DEVICE AND METHOD FOR MANUFACTURING THE SAME

TECHNICAL FIELD

The technical field of the present invention relates to a semiconductor device and a method for manufacturing the semiconductor device. Note that here, semiconductor devices refer to general elements and devices which function utilizing semiconductor characteristics.

BACKGROUND ART

There are a wide variety of metal oxides and such metal oxides are used for various applications. Indium oxide is a well-known material and has been used for transparent electrodes required in liquid crystal display devices or the like.

Some metal oxides have semiconductor characteristics. The examples of such metal oxides having semiconductor characteristics are, for example, tungsten oxide, tin oxide, indium oxide, zinc oxide, and the like. A thin film transistor in which a channel formation region is formed using such metal oxides is already known (for example, see Patent Documents 1 to 4, Non-Patent Document 1, and the like).

As metal oxides, not only single-component oxides but also multi-component oxides are known. For example, $InGaO_3(ZnO)_m$ (m: a natural number) having a homologous phase is known as a multi-component oxide semiconductor including In, Ga, and Zn (for example, see Non-Patent Documents 2 to 4 and the like).

Furthermore, it is confirmed that an oxide semiconductor including such an In—Ga—Zn-based oxide is applicable to a channel formation region of a thin film transistor (for example, see Patent Document 5, Non-Patent Documents 5 and 6, and the like).

REFERENCE

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

A transistor including an oxide semiconductor with a wide band gap has a characteristic of a significantly small off current. On the other hand, the operation speed of a transistor including an oxide semiconductor is not sufficiently high as compared to that of a transistor including a semiconductor material other than an oxide semiconductor, such as single crystal silicon.

In addition, although a transistor including a semiconductor material other than an oxide semiconductor, such as single crystal silicon, has high mobility and is capable of sufficiently high-speed operation, the off current thereof is not low enough to be regarded as substantially zero. Therefore, a slight amount of current flows regardless of the operation state of the semiconductor device, and thus it has been difficult to ensure a sufficient charge holding period in the case of fabrication of a charge-holding semiconductor device such as a memory device or a liquid crystal display device.

Thus, an object of an embodiment of the disclosed invention is to provide a semiconductor device having a novel structure in which a transistor including an oxide semiconductor and a transistor including a semiconductor material other than an oxide semiconductor are stacked.

An embodiment of the present invention is a semiconductor device in which a transistor including an oxide semiconductor and a transistor including a semiconductor material other than an oxide semiconductor are stacked.

An embodiment of the present invention is a semiconductor device in which a transistor whose transistor characteristics are improved by forming an oxide semiconductor layer over a surface with favorable planarity is stacked over a transistor including a semiconductor material other than an oxide semiconductor. The following structures can be employed, for example.

An embodiment of the present invention is a semiconductor device including a first transistor, an insulating layer over the first transistor, and a second transistor over the insulating layer. In this structure, the first transistor includes a first channel formation region, a first gate insulating layer provided over the first channel formation region, a first gate electrode overlapping with the first channel formation region, over the first gate insulating layer, and a first source electrode electrically connected to the first channel formation region and a first drain electrode electrically connected to the first channel formation region, and the second transistor includes a second channel formation region including an oxide semiconductor, a second source electrode electrically connected to the second channel formation region and a second drain electrode electrically connected to the second channel formation region, a second gate electrode overlapping with the second channel formation region, and a second gate insulating layer provided between the second channel formation region and the second gate electrode. In this structure, the first channel formation region includes a semiconductor material different from a semiconductor material of the second channel formation region, and the insulating layer includes a surface whose root-mean-square surface roughness is less than or equal to 1 nm.

Note that it is preferable that a top surface of the first gate electrode be exposed to be included in the same surface as the insulating layer, and that the first gate electrode and the second source electrode or the second drain electrode be in contact with each other on the top surface of the first gate electrode.

In addition, another embodiment of the present invention is a method for manufacturing a semiconductor device comprising the steps of forming a first transistor including a first channel formation region, a first gate insulating layer provided over the first channel formation region, a first gate electrode overlapping with the first channel formation region over the first gate insulating layer, a first source electrode layer electrically connected to the first channel formation region, and a first drain electrode electrically connected to the first channel formation region; forming an insulating layer over the first transistor; planarizing the insulating layer so that a surface of the insulating layer has a root-mean-square surface roughness of less than or equal to 1 nm; and forming a second transistor including a second channel formation region including an oxide semiconductor, a second source electrode electrically connected to the second channel formation region, a second drain electrode electrically connected to the second channel formation region, a second gate electrode overlapping with the second channel formation region, and a gate insulating layer provided between the second channel formation region and the second gate electrode, so as to be in contact with the insulating layer. In this structure, the first channel formation region includes a semiconductor material different from a semiconductor material of the second channel formation region.

Further, another embodiment of the present invention is a method for manufacturing a semiconductor device, comprising the steps of forming a first transistor including a first channel formation region, a first gate insulating layer provided over the first channel formation region, a first gate electrode which overlaps with the first channel formation region and is provided over the first gate insulating layer, a first source electrode electrically connected to the first channel formation region, and a first drain electrode electrically connected to the first channel formation region; forming an insulating layer over the first transistor; planarizing the insulating layer so that a surface of the insulating layer has a root-mean-square roughness of less than or equal to 1 nm and a top surface of the first gate electrode is exposed to be included in the same surface as the insulating layer; and over the insulating layer, forming a second transistor including a second channel formation region including an oxide semiconductor, a second source electrode electrically connected to the second channel formation region, a second drain electrode electrically connected to the second channel formation region, a second gate electrode provided to overlap with the second channel formation region, a second gate insulating layer provided between the second channel formation region and the second gate electrode. In this structure, the second source electrode or the second drain electrode are provided to be in contact with a top surface of the first gate electrode, and the first channel formation region includes a semiconductor material different from a semiconductor material of the second channel formation region.

Note that the second channel formation region is preferably formed over the surface of the insulating layer. In addition, the surface of the insulating layer is preferably planarized by chemical mechanical polishing (CMP) treatment. Further, the first transistor preferably includes impurity regions with the first channel formation region provided therebetween.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

An embodiment of the present invention provides a semiconductor device in which a transistor including a semiconductor material other than an oxide semiconductor is included in a lower portion and a transistor including an oxide semiconductor is included in an upper portion.

With a combination of a transistor including a semiconductor material other than an oxide semiconductor and a transistor including an oxide semiconductor as described above, a novel semiconductor device making use of advantages of characteristics of the respective transistors can be realized.

In addition, a semiconductor device in which a transistor whose transistor characteristics are improved by forming an oxide semiconductor layer over a surface with favorable planarity is stacked over a transistor including a semiconductor material other than an oxide semiconductor can be provided.

BRIEF DESCRIPTION OF DRAWINGS

In the accompanying drawings:

FIGS. 15A to 15H are cross-sectional views according to a process for manufacturing a semiconductor substrate used for manufacturing a semiconductor device;

FIGS. 17A-1, 17A-2, and 17B are circuit diagrams of semiconductor devices;

BEST MODE FOR CARRYING OUT THE INVENTION

Figure 1:
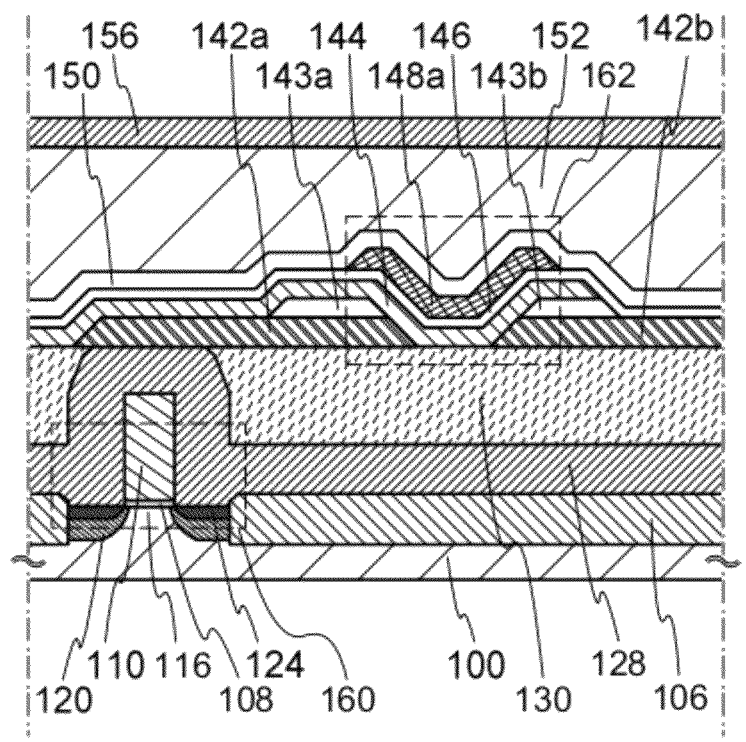
FIG. 1 is a cross-sectional view of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiment modes.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

A structure of a semiconductor device according to an embodiment of the disclosed invention and a method for manufacturing the semiconductor device will be described in this embodiment with reference to FIG. 1, FIGS. 2A to 2D, FIGS. 3A to 3C, FIGS. 4A to 4C, and FIGS. 5A to 5C.

<Cross-sectional Structure of Semiconductor Device>

FIG. 1 is a cross-sectional view of an example of a structure of a semiconductor device. In the semiconductor device illustrated in FIG. 1, a transistor 160 including a first semiconductor material is included in a lower portion, and a transistor 162 including a second semiconductor material is included in an upper portion. Here, the first semiconductor material is preferably different from the second semiconductor material. For example, a semiconductor material other than an oxide semiconductor can be used as the first semiconductor material, and an oxide semiconductor can be used as the second semiconductor material. As the semiconductor material other than an oxide semiconductor, for example, silicon, germanium, silicon germanium, silicon carbide, gallium arsenide, or the like can be used, and a single crystal semiconductor is preferably used. In addition, an organic semiconductor material or the like may be used. A transistor including such a semiconductor material other than an oxide semiconductor can operate at high speed easily. On the other hand, in a transistor including an oxide semiconductor, off current can be sufficiently reduced.

For example, with the transistor 160 in the lower portion which includes the semiconductor material other than an oxide semiconductor, a logic circuit or driver circuit which needs high-speed operation can be formed. In addition, with the transistor 162 in the upper portion which includes an oxide semiconductor, a memory circuit or a display element of a liquid crystal display device which needs sufficient charge holding period can be formed. When the transistors are provided in combination, a novel semiconductor device making use of advantages of characteristics of the respective transistors can be obtained.

Although all the transistors are n-channel transistors here, it is needless to say that p-channel transistors can be used. The technical nature of the disclosed invention is that a transistor including an oxide semiconductor with sufficiently reduced off current and a transistor including a semiconductor material other than an oxide semiconductor which is capable of sufficiently high-speed operation are provided in combination; thus, it is not necessary to limit specific conditions, such as a material used for the semiconductor device or a structure of the semiconductor device, to the structure described here.

The transistor 160 illustrated in FIG. 1 includes a channel formation region 116 provided in a substrate 100 including a semiconductor material (e.g., silicon), impurity regions 120 with the channel formation region 116 provided therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". In other words, in this specification, the term "source electrode" may include a source region and the term "drain electrode" may include a drain region.

Further, an element isolation insulating layer 106 is provided over the substrate 100 so as to surround the transistor 160, and an insulating layer 128 and an insulating layer 130 are provided over the transistor 160. Although not shown, part of the metal compound region 124 of the transistor 160 is connected to a wiring via an electrode functioning as a source electrode or a drain electrode. Note that in order to obtain high integration, the transistor 160 preferably does not have a sidewall insulating layer as illustrated in FIG. 1. On the other hand, in the case where characteristics of the transistor 160 are emphasized, a sidewall insulating layer may be provided on a side surface of the gate electrode 110 and the impurity regions 120 may include an impurity region having a different impurity concentration provided in a region overlapping with the sidewall insulating layer.

The transistor 162 in FIG. 1 includes a source or drain electrode 142*a* and a source or drain electrode 142*b* which are provided over the insulating layer 130; an oxide semiconductor layer 144 electrically connected to the source or drain electrode 142*a* and the source or drain electrode 142*b*; a gate insulating layer 146 covering the source or drain electrode 142*a*, the source or drain electrode 142*b*, and the oxide semiconductor layer 144; a gate electrode 148*a* provided to overlap with the oxide semiconductor layer 144 over the gate insulating layer 146; an insulating layer 143*a* provided in a region between the source or drain electrode 142*a* and the oxide semiconductor layer 144, which overlaps with the gate electrode 148*a*; and an insulating layer 143*b* provided in a region between the source or drain electrode 142*b* and the oxide semiconductor layer 144, which overlaps with the gate electrode 148*a*. Note that in order to reduce capacitance between the source electrode or the drain electrode and the gate electrode, it is preferable to provide the insulating layer 143*a* and the insulating layer 143*b*. However, alternatively, a structure without the insulating layer 143*a* and the insulating layer 143*b* may be employed.

Here, the oxide semiconductor layer 144 is preferably a highly-purified oxide semiconductor layer by sufficiently removing impurities such as hydrogen or sufficiently supplying oxygen. Specifically, the hydrogen concentration of the oxide semiconductor layer 144 is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$. Note that the hydrogen concentration of the oxide semiconductor layer 144 is measured by secondary ion mass spectrometry (SIMS). In the oxide semiconductor layer 144 which is highly purified by sufficiently reducing the hydrogen concentration and in which a defect level in an energy gap due to oxygen deficiency is reduced by supplying a sufficient amount of oxygen, the carrier concentration resulted from hydrogen, an oxygen deficiency, or the like is less than $1\times10^{12}$/cm$^3$, preferably less than $1\times10^{11}$/cm$^3$, or more preferably less than $1.45\times10^{10}$/cm$^3$. It is possible to sufficiently reduce off current in the transistor including the oxide semiconductor layer 144. For example, in a transistor in which the oxide semiconductor layer 144 has a thickness of 30 nm and a channel length is 2 µm, off current (a gate bias: $-3$ V) per channel length of 1 µm at room temperature (25° C.) is less than or equal to 100 zA (1 zA (zeptoampere) is equal to $1\times10^{-21}$ A), or preferably less than or equal to 10 zA. In this manner, by using the highly-purified oxide semiconductor (hereinafter, which is referred to as an i-type (intrinsic) or substantially-i-type oxide semiconductor in this specification), the transistor 162 with excellent off-current characteristics can be obtained.

Here, the oxide semiconductor layer 144 is provided over the insulating layer 130 including a surface whose root-mean-square (RMS) roughness is less than or equal to 1 nm, preferably less than or equal to 0.5 nm. In this manner, by providing the oxide semiconductor layer 144 over the surface with favorable planarity, the oxide semiconductor layer 144 can have favorable planarity and uniformity. Note that at least a portion including the channel formation region of the oxide semiconductor layer may have favorable planarity and uniformity. In addition, by using the oxide semiconductor layer 144 with favorable planarity and uniformity, transistor characteristics of the transistor 162 can be improved. In particular, in the case where the thickness of the oxide semiconductor layer 144 is approximately 10 nm or less, when the oxide semiconductor layer 144 is provided over such a surface with favorable planarity, breaking of the oxide semiconductor layer 144 or the like can be prevented.

By using the oxide semiconductor layer 144 with favorable planarity and uniformity, carrier scattering can be prevented and an interface level can be reduced at an interface with the oxide semiconductor layer. Accordingly, improvement in mobility, reduction in an S-value and off current, and improvement in transistor characteristics are possible in the transistor 162. In addition, improvement in the planarity of the oxide semiconductor layer 144 leads to reduction in gate leakage current of the transistor 162.

Note that in this specification and the like, root-mean-square (RMS) roughness is measured using an atomic force microscope (AFM) with a measurement area of 1 µm×1 µm.

In addition, in this specification and the like, an RMS roughness is obtained by three-dimensionally expanding the RMS roughness of a cross section curve so as to be able to apply to the measurement surface. The RMS can be expressed as the square root of the average value of squares of deviations from the reference surface to the specific surface, and can be obtained by the following formula.

$$R_{ms} = \sqrt{\frac{1}{S_0}\int_{Y_1}^{Y_2}\int_{X_1}^{X_2}\{F(X,Y)-Z_0\}^2 dX dY} \qquad \text{[FORMULA 1]}$$

Note that the measurement surface is a surface which is shown by all the measurement data, and is represented by the following formula.

$$Z=F(X,Y) \qquad \text{[FORMULA 2]}$$

The specific surface is a surface which is an object of roughness measurement, and is a rectangular region which is surrounded by four points represented by the coordinates $(X_1, Y_1)$, $(X_1, Y_2)$, $(X_2, Y_1)$, and $(X_2, Y_2)$. The area of the specific surface when the specific surface is flat ideally is denoted by $S_0$. Note that $S_0$ is obtained by the following formula.

$$S_0=|X_2-X_1|\cdot|Y_2-Y_1| \qquad \text{[FORMULA 3]}$$

In addition, the reference surface refers to a surface parallel to an X-Y surface at the average height of the specific surface. In short, when the average value of the height of the specific surface is denoted by $Z_0$, the height of the reference surface is also denoted by $Z_0$. Note that $Z_0$ can be obtained by the following formula.

$$Z_0 = \frac{1}{S_0}\int_{Y_1}^{Y_2}\int_{X_1}^{X_2} F(X,Y) dX dY \qquad \text{[FORMULA 4]}$$

Although the oxide semiconductor layer 144 which is processed to have an island shape is used in order to suppress leakage current generated between elements due to miniaturization in the transistor 162 of FIG. 1, a structure including the oxide semiconductor layer 144 which is not processed to have an island shape may be employed. In the case where the oxide semiconductor layer is not processed to have an island shape, contamination of the oxide semiconductor layer 144 due to etching in the processing can be prevented.

Note that in the transistor 162, edge portions of the source or drain electrode 142a and the source or drain electrode 142b are preferably tapered. The end portions of the source or drain electrode 142a and the source or drain electrode 142b are tapered, whereby coverage of the oxide semiconductor layer 144 can be improved and breaking can be prevented. Here, a taper angle is, for example, greater than or equal to 30° and less than or equal to 60°. Note that the "taper angle" means an inclination angle formed by a side surface and a bottom surface of a layer (for example, the source or drain electrode 142a) having a tapered shape when being observed in a direction perpendicular to the cross-section (a plane which is perpendicular to the surface of the substrate).

Further, an insulating layer 150 is provided over the transistor 162 and an insulating layer 152 is provided over the insulating layer 150. A wiring 156 connected to the transistor 160 or the transistor 162 is provided over the insulating layer 152.

<Method for Manufacturing Semiconductor Device>

Next, an example of a method for manufacturing the semiconductor device will be described. First, a method for manufacturing the transistor 160 in the lower portion will be described below with reference to FIGS. 2A to 2D and FIGS. 3A to 3C, and then a method for manufacturing the transistor 162 in the upper portion will be described with reference to FIGS. 4A to 4C and FIGS. 5A to 5C.

<Method for Manufacturing Transistor in Lower Portion>

Figure 2A:
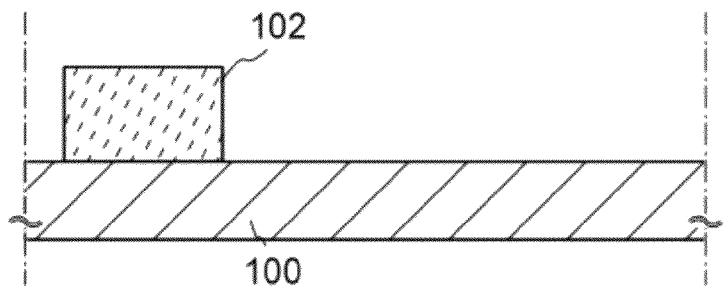
FIGS. 2A to 2D are cross-sectional views according to a process for manufacturing a semiconductor device.
Figure 2B:
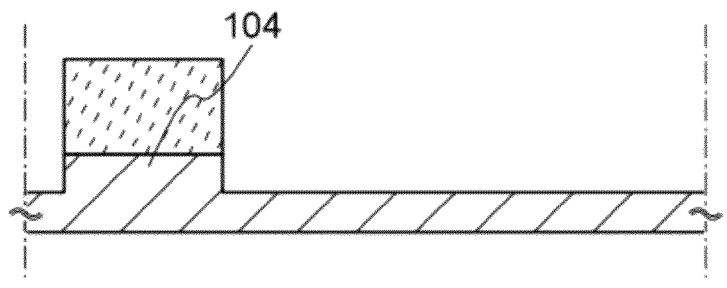

First, the substrate 100 including a semiconductor material is prepared (see FIG. 2A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer provided therebetween.

The case where a single crystal semiconductor substrate such as a single crystal silicon substrate is used as the substrate 100 including a semiconductor material is preferable because the transistor 160 can be operated at higher speed.

A protective layer 102 serving as a mask for forming an element isolation insulating layer is formed over the substrate 100 (see FIG. 2A). As the protective layer 102, for example, an insulating layer formed using silicon oxide, silicon nitride, silicon oxynitride, silicon nitride oxide, or the like can be used. Note that before or after this step, an impurity element imparting n-type conductivity or an impurity element imparting p-type conductivity may be added to the substrate 100 in order to control the threshold voltage of the transistor. When the semiconductor is formed using silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., an exposed region) is removed by etching with the use of the protective layer 102 as a mask. Thus, a semiconductor region 104 which is apart from another semiconductor region is formed (see FIG. 2B). As the etching, dry etching is preferably performed, but wet etching can be performed. An etching gas and an etchant can be selected as appropriate depending on a material of layers to be etched.

Figure 2C:
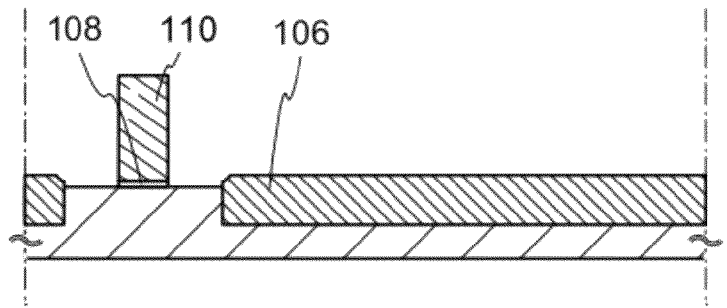

Next, an insulating layer is formed so as to cover the semiconductor region 104 and a region of the insulating layer which overlaps with the semiconductor region 104 is selectively removed, so that the element isolation insulating layer 106 is formed (see FIG. 2C). The insulating layer is formed using silicon oxide, silicon nitride, silicon oxynitride, silicon nitride oxide, or the like. As a method for removing the insulating layer, polishing treatment such as chemical mechanical polishing (CMP), etching treatment, or the like can be given, and any of the above treatment may be used or a combination thereof may be used. Note that the protective layer 102 is removed after the formation of the semiconductor region 104 or after the formation of the element isolation insulating layer 106.

Note that as a method for forming the element isolation insulating layer 106, a method in which an insulating region is formed by introduction of oxygen, or the like can be used instead of the method in which the insulating layer is selective etched.

Next, an insulating layer is formed over a surface of the semiconductor region 104, and a layer including a conductive material is formed over the insulating layer.

The insulating layer is to be a gate insulating layer later and can be formed by performing heat treatment (e.g., thermal oxidation treatment or thermal nitridation treatment) on the surface of the semiconductor region 104, for example. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD method, a sputtering method, or the like. The insulating layer preferably has a single-layer structure or a stacked structure using a film including any of silicon oxide, silicon oxynitride, silicon nitride oxide, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. The thickness of the insulating layer can be, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be used. Note that this embodiment describes an example of the case where the layer containing a conductive material is formed using a metal material.

After that, the insulating layer and the layer including a conductive material are selectively etched, so that the gate insulating layer 108 and the gate electrode 110 are formed (see FIG. 2C).

Figure 2D:
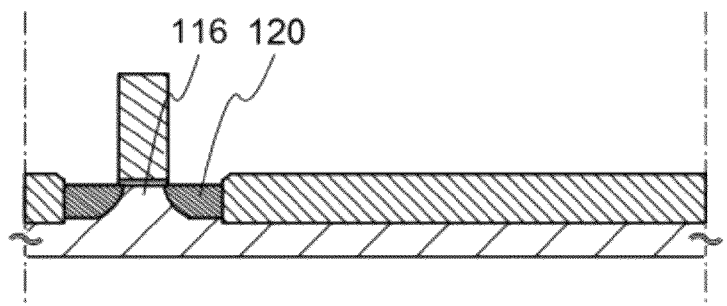

Next, phosphorus (P), arsenic (As), or the like is added to the semiconductor region 104, so that the channel formation region 116 and the impurity regions 120 are formed (see FIG. 2D). Note that phosphorus or arsenic is added here in order to form an n-channel transistor, an impurity element such as boron (B) or aluminum (Al) may be added in the case of forming a p-channel transistor. Here, the concentration of the impurity added can be set as appropriate; the concentration is preferably increased when the size of a semiconductor element is extremely decreased.

Note that a sidewall insulating layer may be formed in the periphery of the gate electrode 110 so that an impurity region to which an impurity element is added at a different concentration may be formed.

Figure 3A:
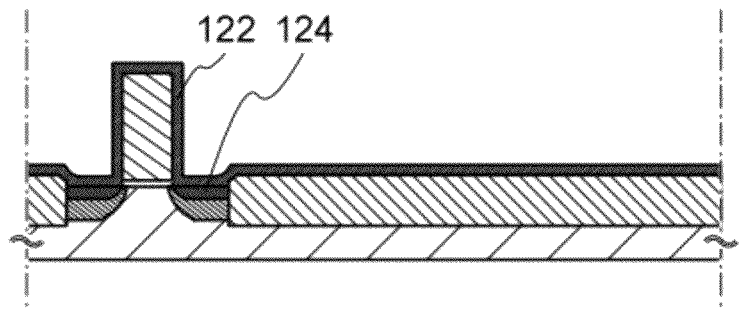
FIGS. 3A to 3C are cross-sectional views according to the process for manufacturing a semiconductor device.

Next, a metal layer 122 is formed so as to cover the gate electrode 110, the impurity regions 120, and the like (see FIG. 3A). A variety of deposition methods such as a vacuum evaporation method, a sputtering method, or a spin coating method can be employed for forming the metal layer 122. The metal layer 122 is preferably formed using a metal material that reacts with a semiconductor material contained in the semiconductor region 104 to be a low-resistance metal compound. Examples of such metal materials include titanium, tantalum, tungsten, nickel, cobalt, and platinum.

Next, heat treatment is performed so that the metal layer 122 reacts with the semiconductor material. Thus, the metal compound regions 124 that are in contact with the impurity regions 120 are formed (see FIG. 3A). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 3B:
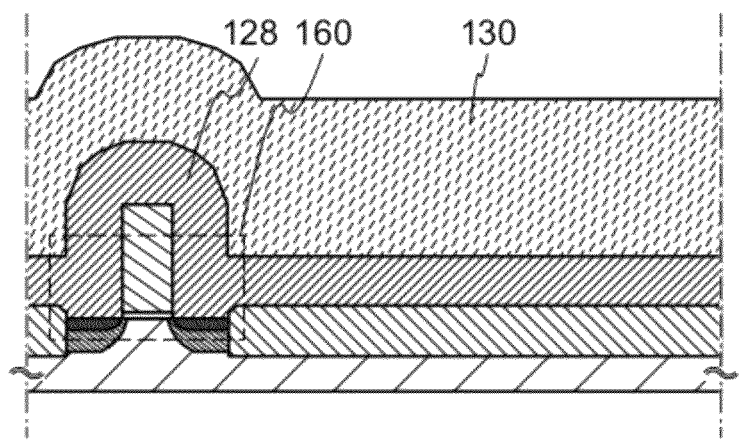

Then, the insulating layer 128 and the insulating layer 130 are formed so as to cover the components formed through the above steps (see FIG. 3B). The insulating layer 128 and the insulating layer 130 can be formed using a material including an inorganic insulating material such as silicon oxide, silicon oxynitride, or aluminum oxide. In particular, the insulating layer 128 and the insulating layer 130 are preferably formed using a low dielectric constant (low-k) material, whereby capacitance caused by an overlap of electrodes or wirings can be sufficiently reduced. Note that a porous insulating layer including these materials may be used for the insulating layer 128 and the insulating layer 130. Since the porous insulating layer has low dielectric constant as compared to a dense insulating layer, capacitance due to electrodes or wirings can be further reduced.

In addition, a layer including an inorganic material containing a large amount of nitride, such as silicon nitride oxide or silicon nitride, may be included in the insulating layer 128 or the insulating layer 130. Thus, the impurity such as water or hydrogen contained in the material included in the transistor 160 in the lower portion can be prevented from entering the oxide semiconductor layer 144 of the transistor 162 in the upper portion that is formed later. Note that in this case, it is difficult to remove the layer including an inorganic insulating material containing a large amount of nitrogen only by CMP treatment performed in a later step; therefore, CMP treatment and etching treatment are preferably performed in combination.

For example, silicon oxynitride and silicon oxide are used for forming the insulating layer 128 and the insulating layer 130, respectively. In this manner, only an inorganic insulating material containing a large amount of oxygen, such as silicon oxynitride or silicon oxide, is used for the insulating layer 128 and the insulating layer 130, whereby CMP treatment can be easily performed on the insulating layer 128 and the insulating layer 130 in a later step.

Note that a stacked structure of the insulating layer 128 and the insulating layer 130 is employed here; however, one embodiment of the disclosed invention is not limited to this. A single-layer structure or a stacked structure including three or more layers can also be used. For example, the following structure may be employed: silicon oxynitride and silicon oxide are used for the insulating layer 128 and the insulating layer 130, respectively, and a silicon nitride oxide film is formed between the insulating layer 128 and the insulating layer 130.

Note that in this specification, "silicon oxynitride" contains more oxygen than nitrogen, and "silicon nitride oxide" contains more nitrogen than oxygen.

Through the above steps, the transistor 160 using the substrate 100 including a semiconductor material is formed (see FIG. 3B). Such a transistor 160 is capable of high-speed operation.

Figure 3C:
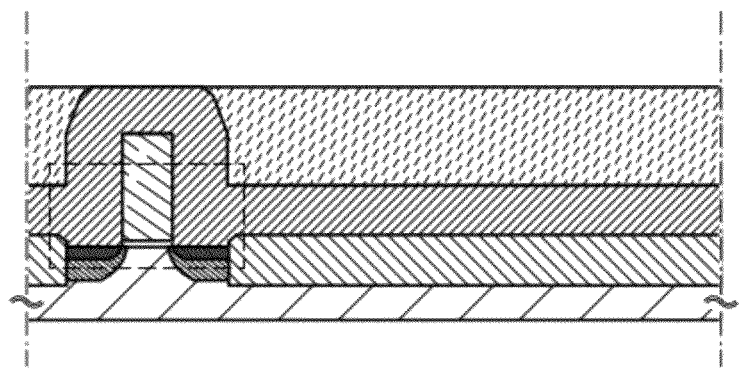

After that, as treatment before formation of the transistor 162, chemical mechanical polishing (CMP) treatment is performed on the insulating layer 128 and the insulating layer 130, so that surfaces of the insulating layer 128 and the insulating layer 130 are planarized (see FIG. 3C). Here, the CMP treatment is treatment of planarizing a surface of an object to be processed by a combination of chemical and mechanical actions using the surface as a reference. In general, the CMP treatment is treatment in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The CMP treatment may be performed once or plural times. When the CMP treatment is performed plural times, first polishing is preferably performed with a high polishing rate followed by final polishing with a low polishing rate. By combining polishing with different polishing rates, planarity of the surfaces of the insulating layer 128 and the insulating layer 130 can be further improved.

As the treatment for planarizing the insulating layer 128 and the insulating layer 130, etching treatment or the like can be performed instead of CMP treatment, and planarization is preferably performed so that each of the surfaces of the insulating layer 128 and the insulating layer 130 has an RMS roughness of less than or equal to 1 nm, or preferably less than or equal to 0.5 nm in order to improve the planarity and the uniformity of the oxide semiconductor layer 144 and improve characteristics of the transistor 162.

In addition, when the stacked layer structure of the insulating layer 128 and the insulating layer 130 includes an inorganic insulating material containing a large amount of nitrogen, such as silicon nitride or silicon nitride oxide, since it is difficult to remove the inorganic insulating material containing a large amount of nitrogen only by the CMP treatment, CMP treatment and etching treatment are preferably performed in combination. As the etching treatment for the inorganic insulating material containing a large amount of nitrogen, either dry etching or wet etching may be used. However, in view of miniaturization of elements, dry etching is preferably used. In addition, it is preferable that etching conditions (an etching gas, an etchant, an etching time, a temperature, or the like) be set appropriately so that etching rates of the respective insulating layers are equal to each other. In addition, as an etching gas for dry etching, for example, a gas containing fluorine (trifluoromethane ($CHF_3$)), a gas to which a rare gas such as helium (He) or argon (Ar) is added, or the like can be used.

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Method for Manufacturing Transistor in Upper Portion>

Figure 4A:
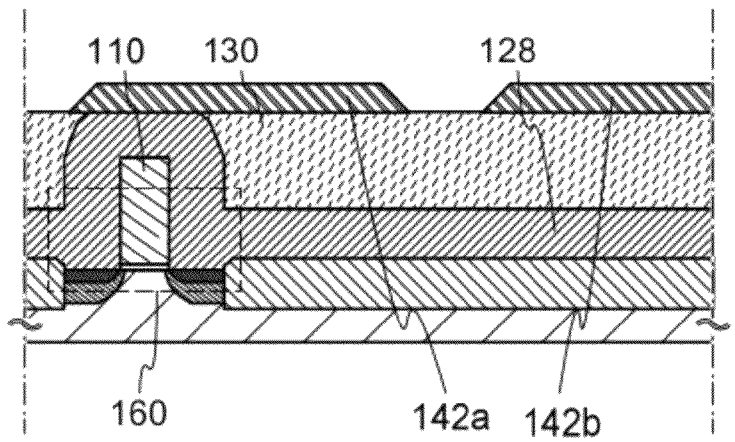
FIGS. 4A to 4C are cross-sectional views according to the process for manufacturing a semiconductor device.

A conductive layer is formed over the gate electrode 110, the insulating layer 128, the insulating layer 130, and the like, and the conductive layer is etched selectively, so that the source or drain electrode 142a and the source or drain electrode 142b are formed (see FIG. 4A).

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Any of manganese, magnesium, zirconium, beryllium, neodymium, and scandium or a material including any of these in combination may be used.

The conductive layer can have a single-layer structure or a stacked structure including two or more layers. For example, a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like can be given. Note that in the case where the conductive layer has a single-layer structure of a titanium film or a titanium nitride film, there is an advantage that the conductive layer is easily processed into the source or drain electrode 142a and the source or drain electrode 142b having tapered shapes.

The conductive layer may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that edge portions of the source or drain electrode 142a and the source or drain electrode 142b are tapered. Here, the tapered angle is preferably greater than or equal to 30° and less than or equal to 60°, for example. The edge portions of the source or drain electrode 142a and the source or drain electrode 142b are etched so as to be tapered; accordingly, the coverage with the gate insulating layer 146 to be formed later is improved and breaking can be prevented.

The channel length (L) of the transistor in the upper portion is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 µm), and the circuit can operate at higher speed. Moreover, miniaturization can lead to low power consumption of a semiconductor device.

Note that an insulating layer functioning as a base may be provided over the insulating layer 128 and the insulating layer 130. The insulating layer can be formed by a PVD method, a CVD method, or the like. In this case, the formed insulating layer preferably includes a surface having an RMS roughness of less than or equal to 1 nm, or preferably less than or equal to 0.5 nm.

Figure 4B:
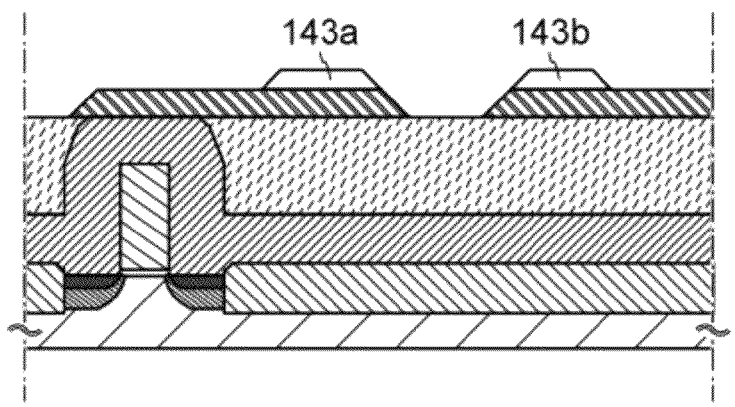

Next, the insulating layer 143a and the insulating layer 143b are formed over the source or drain electrode 142a and the source or drain electrode 142b, respectively (see FIG. 4B). The insulating layer 143a and the insulating layer 143b can be formed in such a manner that an insulating layer covering the source or drain electrode 142a and the source or drain electrode 142b is formed, and then the insulating layer is selectively etched. In addition, the insulating layer 143a and the insulating layer 143b are formed so as to overlap with part of the gate electrode formed later. By providing such an insulating layer, capacitance between the gate electrode and the source or drain electrode can be reduced.

The insulating layer 143a and the insulating layer 143b can be formed using a material including an inorganic insulating material such as silicon oxide, silicon oxynitride, silicon nitride oxide, silicon nitride, or aluminum oxide. In particular, it is preferable that the insulating layer 143a and the insulating layer 143b are formed using a low dielectric constant (low-k) material, because capacitance between the gate electrode and the source or drain electrode can be sufficiently reduced. Note that a porous insulating layer including any of these materials may be used for the insulating layer 143a and the insulating layer 143b. Since the porous insulating layer has low dielectric constant as compared to a dense insulating layer, capacitance between the gate electrode and the source or drain electrode can be further reduced.

Note that in view of reduction in the capacitance between the gate electrode and the source or drain electrode, the insulating layer 143a and the insulating layer 143b are preferably formed; however, a structure without the insulating layer 143a and the insulating layer 143b may be employed.

Figure 4C:
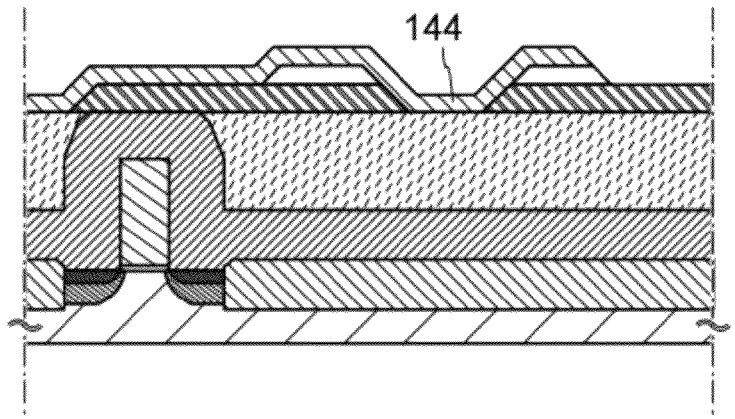

Next, an oxide semiconductor layer is formed so as to cover the source or drain electrode 142a and the source or drain electrode 142b, and then the oxide semiconductor layer is selectively etched, so that the oxide semiconductor layer 144 is formed (see FIG. 4C).

As the oxide semiconductor layer can be used using an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; an In—O-based oxide semiconductor; a Sn—O-based oxide semiconductor; or a Zn—O-based oxide semiconductor.

In particular, an In—Ga—Zn—O-based oxide semiconductor material has sufficiently high resistance when there is no electric field and thus off current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

As a target for forming the oxide semiconductor layer by a sputtering method, a target having a composition ratio of In:Ga:Zn=1:x:y (x is 0 or more and y is more than or equal to 0.5 and less than or equal to 5) is preferably used. For example, a target having a composition ratio of $In_2O_3:Ga_2O_3:ZnO$=1:1:2 [molar ratio], or the like can be used. Alternatively, a target having a composition ratio of $In_2O_3:Ga_2O_3:ZnO$=1:1:1 [molar ratio], a target having a composition ratio of $In_2O_3:Ga_2O_3:ZnO$=1:1:4 [molar ratio], or a target having a composition ratio of $In_2O_3:Ga_2O_3:ZnO$=1:0:2 [molar ratio] can be used.

In this embodiment, the oxide semiconductor layer is formed by a sputtering method with the use of an In—Ga—Zn—O-based metal oxide target.

The relative density of a metal oxide in the metal oxide target is 80% or more, preferably 95% or more, more preferably 99.9% or more. The use of a metal oxide target having high relative density makes it possible to form the oxide semiconductor layer with a dense structure.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas atmosphere from which impurities such as hydrogen, water, hydroxyl, and hydride are removed so that the concentration thereof is decreased to 1 ppm or less (preferably, 10 ppb or less).

In forming the oxide semiconductor layer, the object is held in a treatment chamber that is maintained at reduced pressure and is heated so that the temperature of the object is higher than or equal to 100° C. and lower than 550° C., preferably higher than or equal to 200° C. and lower than or equal to 400° C. Alternatively, the temperature of the object in the formation of the oxide semiconductor layer may be room temperature (25° C.±10° C.). Then, a sputtering gas from which hydrogen, water, and the like are removed is introduced into the treatment chamber while moisture in the treatment chamber is removed, whereby the oxide semiconductor layer is formed using the above target. By forming the oxide semiconductor layer while heating the object, impurities in the oxide semiconductor layer can be reduced. In addition, damage due to the sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By performing evacuation with the use of a cryopump or the like, hydrogen, water, and the like can be removed from the treatment chamber; thus, the impurity concentration in the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct-current (DC) power source is preferably used because dust (such as powder substances formed at the time of the film formation) can be reduced and the film thickness can be uniform. The thickness of the oxide semiconductor layer is greater than or equal to 1 nm and less than or equal to 50 nm, preferably greater than or equal to 1 nm and less than or equal to 30 nm, more preferably greater than or equal to 1 nm and less than or equal to 10 nm. With the oxide semiconductor layer having such a thickness, a short-channel effect which occurs along with miniaturization can be suppressed. Note that the appropriate thickness varies depending on the material for the oxide semiconductor, the usage of the semiconductor device, or the like, and thus the thickness can be selected as appropriate depending on the material, the usage, or the like.

Here, the oxide semiconductor layer 144 is provided over the insulating layer 130 including the surface having an RMS roughness of less than or equal to 1 nm, or preferably less than or equal to 0.5 nm. When the oxide semiconductor layer 144 is provided over the surface having favorable planarity in this manner, favorable planarity and uniformity of the oxide semiconductor layer 144 can be obtained. Further, by using the oxide semiconductor layer 144 with favorable planarity and uniformity, transistor characteristics of the transistor 162 can be improved.

Note that before the oxide semiconductor layer is formed by a sputtering method, reverse sputtering in which plasma is generated with an argon gas introduced is preferably performed, so that dust attached to a surface on which the oxide semiconductor layer is formed (e.g., a surface of the insulating layer 130) is removed. Here, the reverse sputtering is a method by which ions collide with a surface to be processed of a substrate so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near an object. Note that an atmosphere of nitrogen, helium, oxygen, or the like may be used instead of an argon atmosphere.

After that, heat treatment (first heat treatment) is preferably performed on the oxide semiconductor layer. Excessive hydrogen (including water and hydroxyl group) in the oxide semiconductor layer is removed by the first heat treatment and a structure of the oxide semiconductor layer is improved, so that a defect level in energy gap of the oxide semiconductor layer can be reduced. The temperature of the first heat treatment is set to higher than or equal to 300° C. and lower than 550° C., or higher than or equal to 400° C. and lower than or equal to 500° C.

The heat treatment can be performed in such a way that, for example, an object is introduced into an electric furnace in which a resistance heating element or the like is used and heated, in a nitrogen atmosphere at 450° C. for one hour.

During the heat treatment, the oxide semiconductor layer is not exposed to the air to prevent the entry of water and hydrogen.

The heat treatment apparatus is not limited to the electric furnace and may be an apparatus for heating an object by thermal conduction or thermal radiation from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect level in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is greater than or equal to 6N (99.9999%), preferably greater than or equal to 7N (99.99999%) (that is, the impurity concentration is less than or equal to 1 ppm, preferably less than or equal to 0.1 ppm).

In any case, the i-type (intrinsic) or substantially i-type oxide semiconductor layer in which impurities are reduced by the first heat treatment is formed, which enables a transistor having excellent characteristics to be realized.

The above heat treatment (the first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be conducted once or also plural times.

The oxide semiconductor layer may be etched either before or after the heat treatment. In view of miniaturization of elements, dry etching is preferably used; however, wet etching may be used. An etching gas and an etchant can be selected as appropriate depending on a material of layers to be etched. Note that in the case where leakage current in an element does not cause a problem, the oxide semiconductor layer may be used without being processed to have an island shape.

Figure 5A:
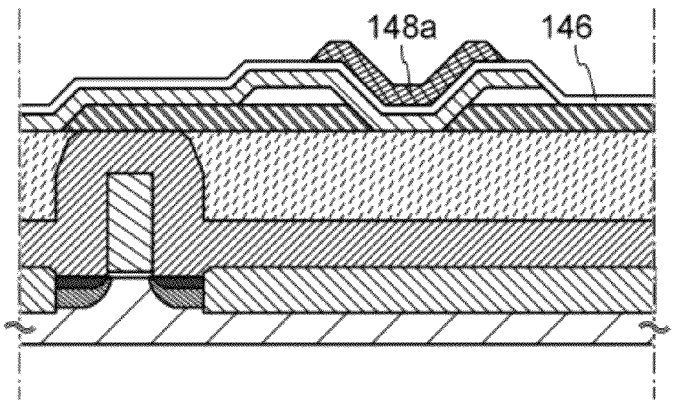
FIGS. 5A to 5C are cross-sectional views according to the process for manufacturing a semiconductor device.

Next, the gate insulating layer 146 in contact with the oxide semiconductor layer 144 is formed, and then the gate electrode 148a is formed in a region overlapping with the oxide semiconductor layer 144, over the gate insulating layer 146 (see FIG. 5A).

The gate insulating layer 146 can be formed by a CVD method, a sputtering method, or the like. The gate insulating layer 146 is preferably formed so as to include silicon oxide, silicon nitride, silicon oxynitride, silicon nitride oxide, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. Note that the gate insulating layer 146 may have a single-layer structure or a stacked structure. There is no particular limitation on the thickness thereof; however, in the case where the semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 146, electrical characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The heat treatment is performed at a temperature higher than or equal to 200° C. and lower than or equal to 450° C., or preferably higher than or equal to 250° C. and lower than or equal to 350° C. For example, the heat treatment may be performed at 250° C. for one hour in a nitrogen atmosphere. The second heat treatment can reduce variation in electrical characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is performed, so that the oxide semiconductor layer 144 can be highly purified so as to contain impurities which are not main components as little as possible.

The gate electrode 148a can be formed in such a manner that a conductive layer is formed over the gate insulating layer 146 and then selectively etched. The conductive layer to be the gate electrode 148a can be formed by a PVD method typified by a sputtering method or a CVD method such as a plasma CVD method. The details are similar to those of the source or drain electrode 142a or the like; thus, the description thereof can be referred to.

Figure 5B:
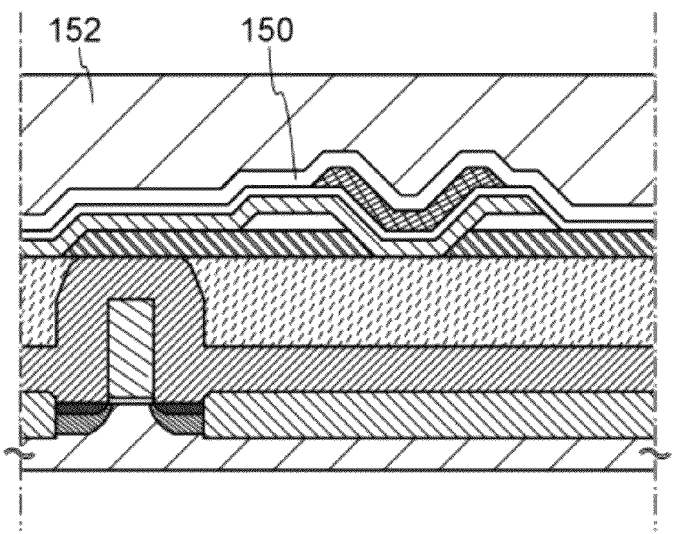

Next, the insulating layer 150 and the insulating layer 152 are formed over the gate insulating layer 146 and the gate electrode 148a (see FIG. 5B). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride oxide, silicon nitride, hafnium oxide, or aluminum oxide.

Note that a low dielectric constant material or a structure having a low dielectric constant (e.g., a porous structure) is preferably employed for the insulating layer 150 and the insulating layer 152 because when the insulating layer 150 and the insulating layer 152 each have a low dielectric constant, capacitance generated between wirings, electrodes, or the like can be reduced and thus, high-speed operation can be obtained.

Note that a stacked structure of the insulating layer 150 and the insulating layer 152 is used in this embodiment, but an embodiment of the disclosed invention is not limited thereto. A single-layer structure or a stacked structure including three or more layers can also be used. Alternatively, the insulating layer may be omitted.

Note that the insulating layer 152 is preferably formed so as to have a planarized surface. By forming the insulating layer 152 so as to have a planarized surface, an electrode, a wiring, or the like can be favorably formed over the insulating layer 152 even in the case where the semiconductor device is miniaturized, for example. The insulating layer 152 can be planarized using a method such as CMP.

Figure 5C:
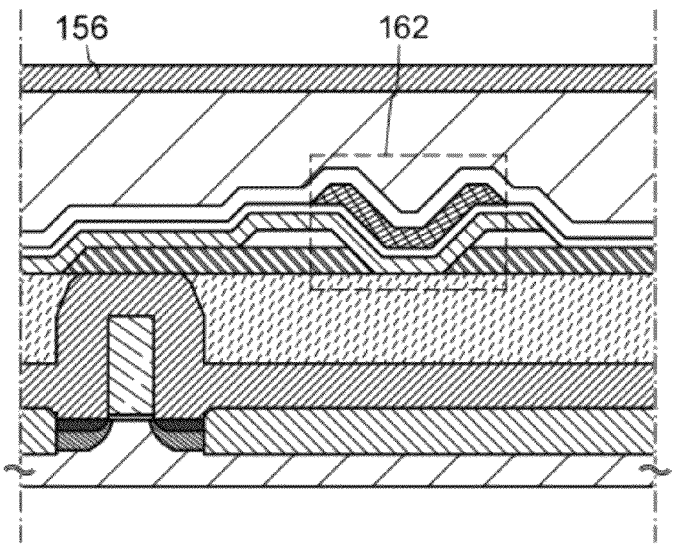

An electrode (not shown) for electrically connecting the transistor 160 or the transistor 162 and the wiring 156 is formed, and then the wiring 156 is formed over the insulating layer 152 (see FIG. 5C). Needless to say, all of these elements are not electrically connected to each other necessarily. An element independent of the other elements may be included.

The wiring 156 is formed in such a manner that a conductive layer is formed using a PVD method including a sputtering method or a CVD method such as a plasma CVD method and then the conductive layer is patterned. As a material of the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, beryllium, neodymium, or scandium may be used. The details are similar to those of the source or drain electrode 142a or the like.

Through the above steps, the transistor 162 using the highly-purified oxide semiconductor layer 144 is completed (see FIG. 5C).

With the use of the highly-purified intrinsic oxide semiconductor layer 144, off current of the transistor 162 can be sufficiently reduced.

As described above, the semiconductor device can be provided, in which the transistor including a semiconductor material other than an oxide semiconductor is included in the lower portion and the transistor including an oxide semiconductor is included in the upper portion.

With a combination of the transistor including a semiconductor material other than an oxide semiconductor and the transistor including an oxide semiconductor as described above, a novel semiconductor device making use of advantages of characteristics of the respective transistors can be realized.

In addition, the semiconductor device can be provided, in which the transistor whose transistor characteristics are improved by providing the oxide semiconductor layer over the surface with favorable planarity is stacked over the transistor including a semiconductor material other than an oxide semiconductor.

The structures, methods, and the like described in this embodiment can be combined as appropriate with any of the structures, methods, and the like described in the other embodiments.

Embodiment 2

In this embodiment, a structure and a method for manufacturing a semiconductor device according to an embodiment of the disclosed invention will be described with reference to FIGS. 6A and 6B, FIGS. 7A and 7B, FIGS. 8A and 8B, FIGS. 9A and 9B, FIGS. 10A to 10D, FIGS. 11A to 11C, FIGS. 12A to 12D, and FIGS. 13A to 13C. In particular, an example of a structure of a semiconductor device which can be used as a memory device will be described in this embodiment.
<Cross-Sectional Structure and Planar Structure of Semiconductor Device>

Figure 6A:
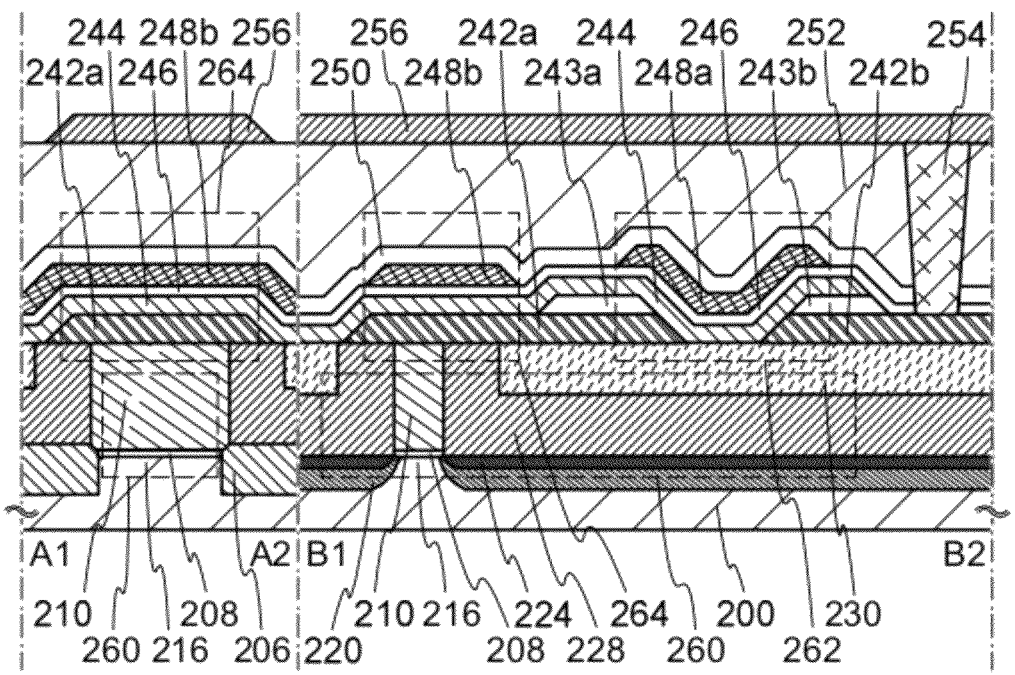
FIGS. 6A and 6B are a cross-sectional view and a plan view of a semiconductor device.
Figure 6B:
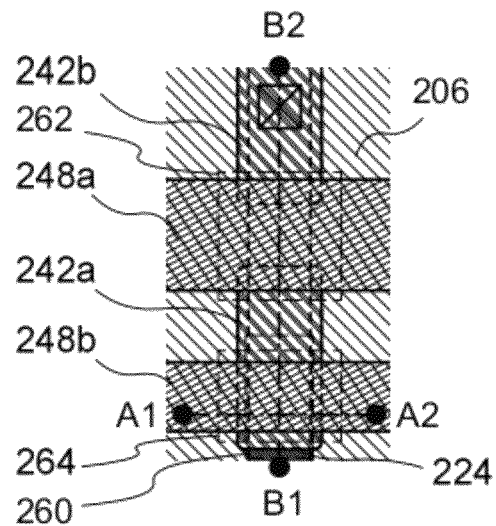

FIGS. 6A and 6B illustrate an example of a structure of a semiconductor device. FIG. 6A illustrates a cross section of the semiconductor device, and FIG. 6B illustrates a plan view of the semiconductor device. Here, FIG. 6A corresponds to a cross section along line A1-A2 and line B1-B2 in FIG. 6B. In the semiconductor device illustrated in FIGS. 6A and 6B, a transistor 260 including a first semiconductor material is provided in a lower portion, a transistor 262 including a second semiconductor material is provided in an upper portion, and a gate electrode 210 of the transistor 260 and a source or drain electrode 242a of the transistor 262 are directly connected to each other. Here, the first semiconductor material is preferably different from the second semiconductor material. For example, a semiconductor material other than an oxide semiconductor can be used as the first semiconductor material and an oxide semiconductor can be used as the second semiconductor material. Note that as the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material may be used. The transistor 260 including such a semiconductor material can be operated at high speed easily. On the other hand, the transistor 262 including an oxide semiconductor has off current which is sufficiently reduced, so that the transistor 262 can hold charge for a long time.

Therefore, when the transistor 262 is in an off state, the potential of the gate electrode 210 of the transistor 260 can be held for an extremely long time. When a capacitor 264 is provided, electric charge supplied to the gate electrode 210 of the transistor 260 can be held easily and reading of held data can be performed easily. In addition, since the transistor 260 including such a semiconductor material is capable of operating at sufficiently high speed, reading speed of data can be improved.

Although all the transistors are n-channel transistors here, it is needless to say that p-channel transistors can be used. The technical nature of the disclosed invention is that a transistor including an oxide semiconductor with sufficiently reduced off current and a transistor including a semiconductor material other than an oxide semiconductor which is capable of sufficiently high-speed operation are provided in combination; thus, it is not necessary to limit specific conditions, such as a material used for the semiconductor device or a structure of the semiconductor device, to the structure described here.

The transistor 260 illustrated in FIGS. 6A and 6B includes a channel formation region 216 provided in a substrate 200 including a semiconductor material (e.g., silicon), impurity regions 220 with the channel formation region 216 provided therebetween, metal compound regions 224 in contact with the impurity regions 220, a gate insulating layer 208 provided over the channel formation region 216, and the gate electrode 210 provided over the gate insulating layer 208. In short, the structure of the transistor 260 is similar to that of the transistor 160 described in Embodiment 1. Note that a transistor whose source electrode and drain electrode are not illustrated in a drawing may be referred to as a transistor for the sake of convenience.

Further, an element isolation insulating layer 206 is provided over the substrate 200 so as to surround the transistor 260, and an insulating layer 228 and an insulating layer 230 are provided over the transistor 260. Although not shown, part of the metal compound region 224 of the transistor 260 is connected to a wiring 256 or another wiring via electrodes functioning as a source electrode and a drain electrode. Note that in order to obtain high integration, the transistor 260 preferably does not have a sidewall insulating layer as illustrated in FIGS. 6A and 6B. On the other hand, in the case where characteristics of the transistor 260 are emphasized, a sidewall insulating layer may be provided on a side surface of the gate electrode 210 and the impurity regions 220 may include an impurity region having a different impurity concentration provided in a region overlapping with the sidewall insulating layer.

The transistor 262 in FIGS. 6A and 6B includes the source or drain electrode 242a and a source or drain electrode 242b which are provided over the insulating layer 230; an oxide semiconductor layer 244 electrically connected to the source or drain electrode 242a and the source or drain electrode 242b; a gate insulating layer 246 covering the source or drain electrode 242a, the source or drain electrode 242b, and the oxide semiconductor layer 244; a gate electrode 248a provided to overlap with the oxide semiconductor layer 244, over the gate insulating layer 246; an insulating layer 243a provided in a region between the source or drain electrode 242a and the oxide semiconductor layer 244, which overlaps with the gate electrode 248a; and an insulating layer 243b provided in a region between the source or drain electrode 242b and the oxide semiconductor layer 244, which overlaps with the gate electrode 248a. Note that in order to reduce capacitance between the source electrode or the drain electrode and the gate electrode, it is preferable to provide the insulating layer 243a and the insulating layer 243b. However, alternatively, a structure without the insulating layer 243a and the insulating layer 243b may be employed. In short, the structure of the transistor 262 is similar to that of the transistor 162 described in Embodiment 1.

In a similar manner to the oxide semiconductor layer 144 described in Embodiment 1, the oxide semiconductor layer 244 is preferably a highly-purified oxide semiconductor layer by sufficiently removing impurities such as hydrogen or sufficiently supplying oxygen. In this manner, by using a highly-purified oxide semiconductor, the transistor 262 with excellent off-current characteristics can be obtained. Embodiment 1 can be referred to for the details of the oxide semiconductor layer 244.

Here, the oxide semiconductor layer 244 is provided over the insulating layer 230 including a surface whose RMS roughness is less than or equal to 1 nm, preferably less than or equal to 0.5 nm. In this manner, by providing the oxide semiconductor layer 244 over the surface with favorable planarity, favorable planarity and uniformity of the oxide semiconductor layer 244 can be obtained.

By using the oxide semiconductor layer 244 with favorable planarity and uniformity, carrier scattering can be prevented and an interface level can be reduced at an interface with the oxide semiconductor layer. Accordingly, improvement in mobility, reduction in an S-value and off current, and improvement in transistor characteristics are possible in the transistor 262. In addition, improvement in the planarity of the oxide semiconductor layer 244 leads to reduction in gate leakage current of the transistor 262.

Although the oxide semiconductor layer 244 which is processed to have an island shape is used in order to suppress leakage current generated between elements due to miniaturization in the transistor 262 in FIG. 6, a structure including the oxide semiconductor layer 244 which is not processed to have an island shape may be employed. In the case where the oxide semiconductor layer is not processed to have an island shape, contamination of the oxide semiconductor layer 244 due to etching in processing can be prevented.

A difference between the semiconductor device in FIGS. 6A and 6B and the semiconductor device in FIG. 1 is whether or not the gate electrode of the transistor in the lower portion is directly connected to the source or drain electrode of the transistor in the upper portion. As in the semiconductor device in FIGS. 6A and 6B, when the gate electrode 210 whose top surface is exposed from the insulating layer 230 and the source or drain electrode 242a are directly connected to each other, higher integration of the semiconductor device can be achieved as compared to the case where an opening and an electrode for connection are separately formed so that the gate electrode 210 is connected to the source or drain electrode 242a because a contact area can be reduced. In addition, a step necessary for forming an opening and an electrode which are separately formed for the contact can be omitted; therefore, a process for manufacturing a semiconductor device can be simplified.

In addition, a difference between the semiconductor device in FIG. 1 and the semiconductor device in FIGS. 6A and 6B is whether the capacitor 264 is provided or not. The capacitor 264 in FIGS. 6A and 6B includes the source or drain electrode 242a, the oxide semiconductor layer 244, the gate insulating layer 246, and an electrode 248b. That is, the source or drain electrode 242a functions as one electrode of the capacitor 264, and the electrode 248b functions as the other electrode of the capacitor 264.

Note that in the capacitor 264 in FIGS. 6A and 6B, insulating properties between the source or drain electrode 242a and the electrode 248b can be adequately secured by stacking the oxide semiconductor layer 244 and the gate insulating layer 246. Needless to say, the capacitor 264 may employ a structure without the oxide semiconductor layer 244 in order to secure sufficient capacitance. Further, the capacitor 264 having a structure including an insulating layer formed in a similar manner to the insulating layer 243a may be employed. In the case where a capacitor is not needed, it is possible to employ a structure without the capacitor 264.

Note that in the transistor 262 and the capacitor 264, edge portions of the source or drain electrode 242a and source or drain electrode 242b are preferably tapered. This is because when the edge portions of the source or drain electrode 242a and the source or drain electrode 242b are tapered, the coverage with the oxide semiconductor layer 244 can be improved and breaking can be prevented. Here, a taper angle is, for example, greater than or equal to 30° and less than or equal to 60°. Note that the taper angle is a tilt angle formed by a side surface and a bottom surface of a layer having a tapered shape (e.g., the source or drain electrode 242a) in the case where the layer is observed from a direction perpendicular to a cross section (a plane perpendicular to the surface of a substrate).

In this embodiment, the transistor 262 and the capacitor 264 are provided so as to overlap with the transistor 260. By employing such a planar layout, high integration is possible. For example, given that the minimum processing dimension is F, the area occupied by a memory cell can be 15 $F^2$ to 25 $F^2$ by devising a connection between a wiring and an electrode.

Further, an insulating layer 250 is provided over the transistor 262 and the capacitor 264, and an insulating layer 252 is provided over the insulating layer 250. An electrode 254 is provided in an opening formed in the gate insulating layer 246, the insulating layer 250, the insulating layer 252, and the like, and the wiring 256 connected to the electrode 254 is provided over the insulating layer 252. Here, a difference between the semiconductor device in FIG. 1 and the semiconductor device in FIGS. 6A and 6B is whether the electrode 254 is provided or not. Note that the source or drain electrode 242b and the wiring 256 are connected to each other with the electrode 254 in FIGS. 6A and 6B; however, the disclosed invention is not limited thereto. For example, the wiring 256 may be directly in contact with the source or drain electrode 242b.

In addition, an electrode (not shown) connected to the metal compound region 224 may be connected to the source or drain electrode 242b. In this case, the electrode connected to the metal compound region 224 and the electrode 254 connecting the source or drain electrode 242b and the wiring 256 are preferably provided so as to be overlap with each other. By employing such a layout, high integration of the semiconductor device can be obtained.

Note that a top-gate transistor in which an oxide semiconductor layer is provided over source and drain electrodes is used as the transistor 262 in the semiconductor device of FIGS. 6A and 6B; however, the structure of the semiconductor device according to this embodiment is not limited thereto. For example, the semiconductor device may have any of structures illustrated in FIGS. 7A and 7B, FIGS. 8A and 8B, and FIGS. 9A and 9B.

Figure 7A:
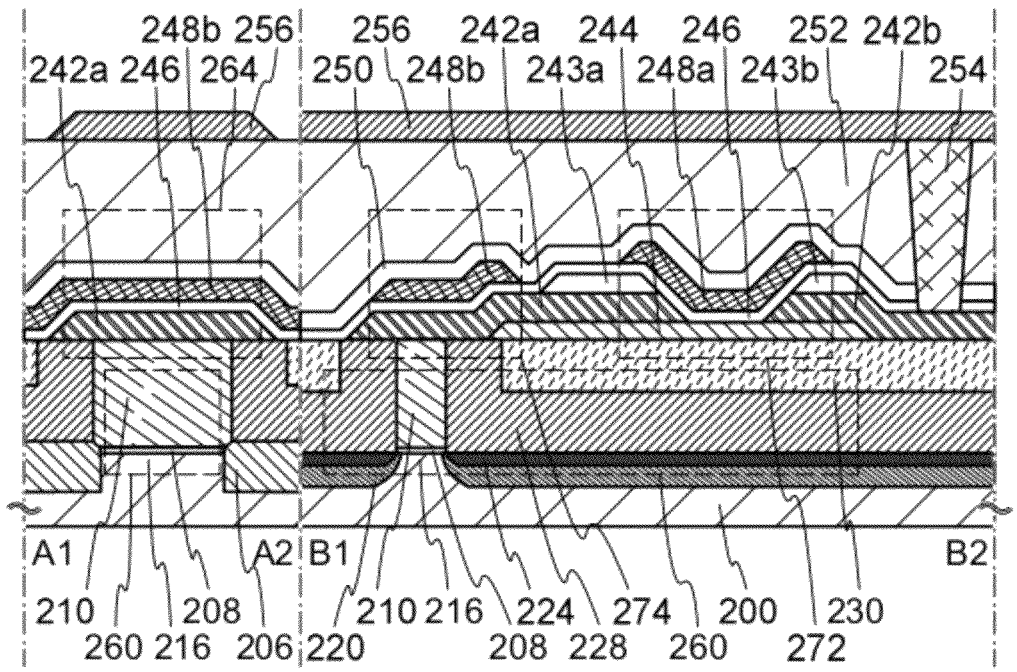
FIGS. 7A and 7B are a cross-sectional view and a plan view of a semiconductor device.
Figure 7B:
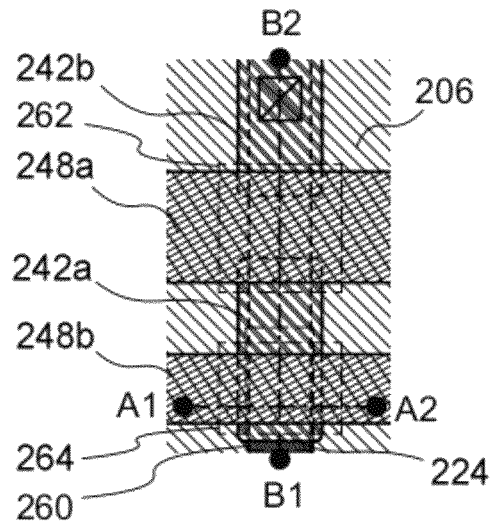

FIGS. 7A and 7B illustrate an example of the structure of the semiconductor device. FIGS. 7A and 7B illustrate a cross-sectional view and a plan view of the semiconductor device, respectively. Here, FIG. 7A corresponds to a cross section along line A1-A2 and line B1-B2 in FIG. 7B.

The semiconductor device in FIGS. 7A and 7B is different from the semiconductor device in FIGS. 6A and 6B in that the source or drain electrode 242a and the source or drain electrode 242b are provided over the oxide semiconductor layer 244. Accordingly, the structures of the transistor 272 and the capacitor 274 in the semiconductor device in FIGS. 7A and 7B are different from those of the transistor 262 and the capacitor 264 in the semiconductor device in FIGS. 6A and 6B.

The transistor 272 in FIGS. 7A and 7B includes the oxide semiconductor layer 244 provided over the insulating layer 230, the source or drain electrode 242a and the source or drain electrode 242b which are provided over and electrically connected to the oxide semiconductor layer 244; the gate insulating layer 246 covering the source or drain electrode 242a, the source or drain electrode 242b, and the oxide semiconductor layer 244; the gate electrode 248a provided to overlap with the oxide semiconductor layer 244, over the gate insulating layer 246; the insulating layer 243a provided in a region between the source or drain electrode 242a and the gate insulating layer 246, which overlaps with the gate electrode 248a; and the insulating layer 243b provided in a region between the source or drain electrode 242b and the gate insulating layer 246, which overlaps with the gate electrode 248a.

The capacitor 274 in FIGS. 7A and 7B includes the source or drain electrode 242a, the gate insulating layer 246, and the electrode 248b. That is, the source or drain electrode 242a functions as one electrode of the capacitor 274, and the electrode 248b functions as the other electrode of the capacitor 274.

The structures other than those described above in the semiconductor device in FIGS. 7A and 7B are the same as those in the semiconductor device in FIGS. 6A and 6B, and therefore, the semiconductor device in FIGS. 6A and 6B can be referred to.

Figure 8A:
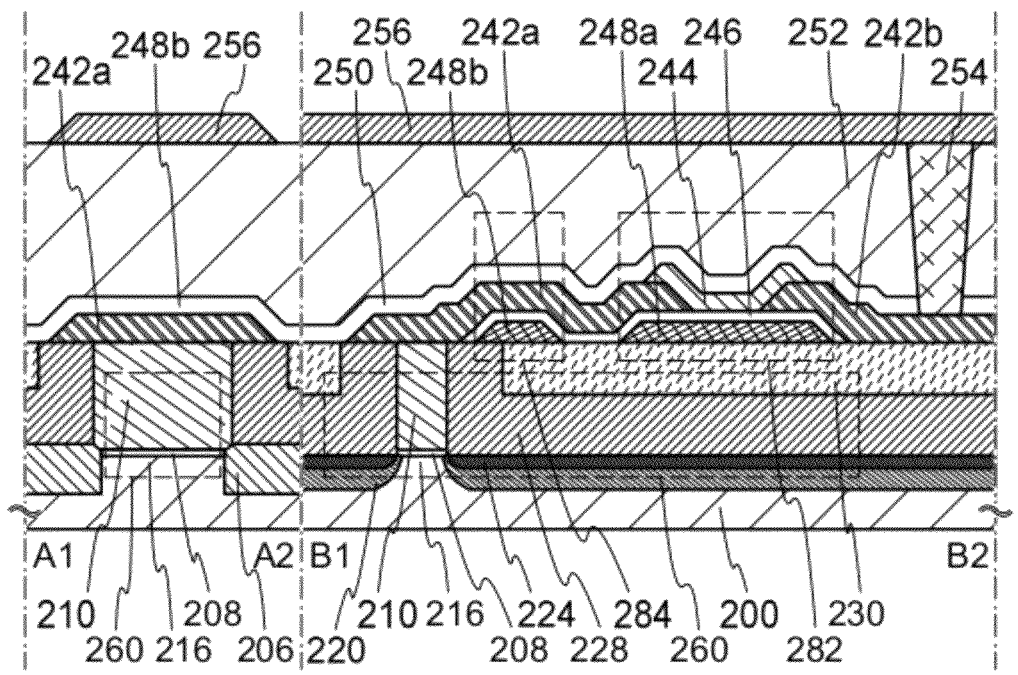
FIGS. 8A and 8B are a cross-sectional view and a plan view of a semiconductor device.
Figure 8B:
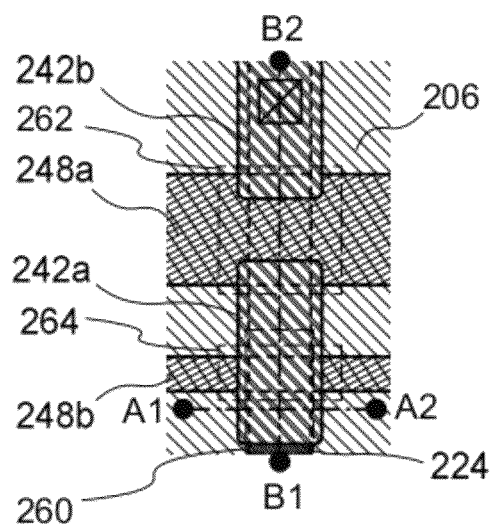

FIGS. 8A and 8B illustrate an example of the structure of the semiconductor device. FIGS. 8A and 8B illustrate a cross-sectional view and a plan view of the semiconductor device, respectively. Here, FIG. 8A corresponds to a cross section along line A1-A2 and line B1-B2 in FIG. 8B.

The semiconductor device in FIGS. 8A and 8B is different from the semiconductor device in FIGS. 6A and 6B in that the gate insulating layer 246, the oxide semiconductor layer 244, the source or drain electrode 242a, and the source or drain electrode 242b are provided over the gate electrode 248a. In other words, a transistor 282 in the semiconductor device in FIGS. 8A and 8B is a bottom-gate transistor. Accordingly, the structures of the transistor 282 and a capacitor 284 in the semiconductor device in FIGS. 8A and 8B are different from those of the transistor 262 and the capacitor 264 in the semiconductor device in FIGS. 6A and 6B.

The transistor 282 in FIGS. 8A and 8B includes the gate electrode 248a provided over the insulating layer 230, the gate insulating layer 246 covering the gate electrode 248a, the source or drain electrode 242a and the source or drain electrode 242b which are provided over the gate insulating layer 246, and the oxide semiconductor layer 244 which is provided over and electrically connected to the source or drain electrode 242a and the source or drain electrode 242b. Note that the transistor 282 does not include the insulating layer 243a and the insulating layer 243b.

The capacitor 284 in FIGS. 8A and 8B includes the source or drain electrode 242a, the gate insulating layer 246, and the electrode 248b. That is, the source or drain electrode 242a functions as one electrode of the capacitor 284, and the electrode 248b functions as the other electrode of the capacitor 284.

The structures other than those described above in the semiconductor device in FIGS. 8A and 8B are the same as those in the semiconductor device in FIGS. 6A and 6B, and therefore, the semiconductor device in FIGS. 6A and 6B can be referred to.

Figure 9A:
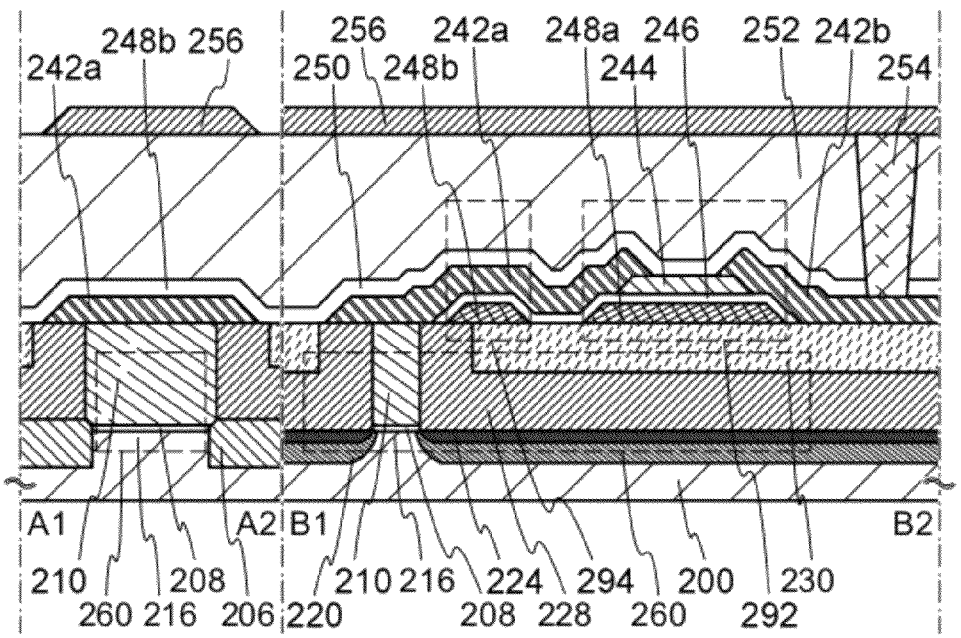
FIGS. 9A and 9B are a cross-sectional view and a plan view of a semiconductor device.
Figure 9B:
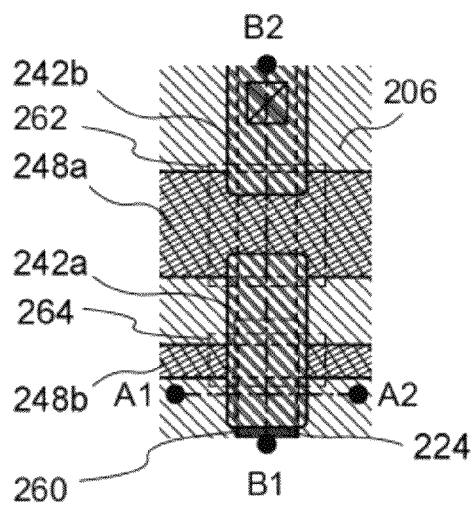

FIGS. 9A and 9B illustrate an example of the structure of the semiconductor device. FIGS. 9A and 9B illustrate a cross-sectional view and a plan view of the semiconductor device, respectively. Here, FIG. 9A corresponds to a cross section along line A1-A2 and line B1-B2 in FIG. 9B.

The semiconductor device in FIGS. 9A and 9B is different from the semiconductor device in FIGS. 6A and 6B in that the gate insulating layer 246, the oxide semiconductor layer 244, the source or drain electrode 242a, and the source or drain electrode 242b are provided over the gate electrode 248a. In other words, a transistor 292 in the semiconductor device in FIGS. 9A and 9B is a bottom-gate transistor. Accordingly, the structures of the transistor 292 and a capacitor 294 in the semiconductor device in FIGS. 9A and 9B are different from those of the transistor 262 and the capacitor 264 in the semiconductor device in FIGS. 6A and 6B. The semiconductor device in FIGS. 9A and 9B is different from the semiconductor device in FIGS. 8A and 8B in that the source or drain electrode 242a and the source or drain electrode 242b are provided over the oxide semiconductor layer 244.

The transistor 292 in FIGS. 9A and 9B includes the gate electrode 248a provided over the insulating layer 230, the gate insulating layer 246 covering the gate electrode 248a, the oxide semiconductor layer 244 provided over the gate insulating layer 246, the source or drain electrode 242a and the source or drain electrode 242b which are provided over and electrically connected to the oxide semiconductor layer 244. Note that the transistor 292 does not include the insulating layer 243a and the insulating layer 243b.

The capacitor 294 in FIGS. 9A and 9B includes the source or drain electrode 242a, the gate insulating layer 246, and the electrode 248b. That is, the source or drain electrode 242a functions as one electrode of the capacitor 294, and the electrode 248b functions as the other electrode of the capacitor 294.

The structures other than those described above in the semiconductor device in FIGS. 9A and 9B are the same as those in the semiconductor device in FIGS. 6A and 6B, and therefore, the semiconductor device in FIGS. 6A and 6B can be referred to.

<Example of Method for Manufacturing Semiconductor Device>

Next, an example of a method for manufacturing the semiconductor device will be described. First, a method for manufacturing the transistor 260 in the lower portion will be described below with reference to FIGS. 10A to 10D and FIGS. 11A to 11C, and then a method for manufacturing the transistor 262 and the capacitor 264 in the upper portion will be described with reference to FIGS. 12A to 12D and FIGS. 13A to 13C.

<Method for Manufacturing Transistor in Lower Portion>

Figure 10A:
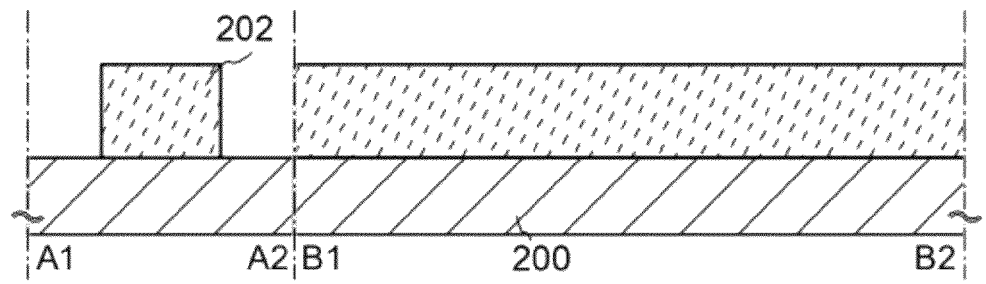
FIGS. 10A to 10D are cross-sectional views according to a process for manufacturing a semiconductor device.
Figure 10B:
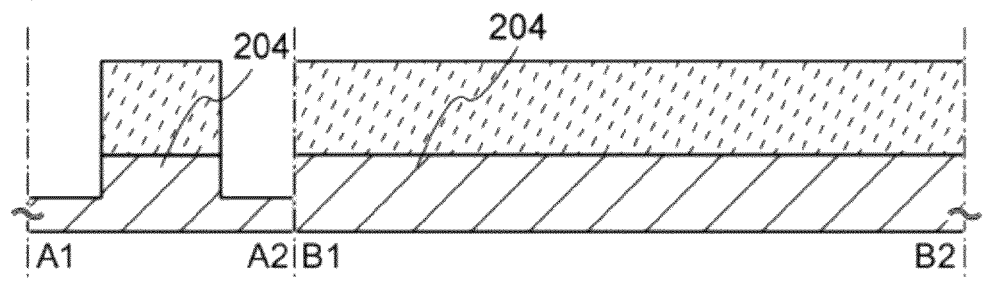

First, the substrate 200 including a semiconductor material is prepared, and a protective layer 202 serving as a mask for forming an element isolation insulating layer is formed over the substrate 200 (see FIG. 10A).

Here, the same material as that of the substrate 100 in Embodiment 1 can be used for the substrate 200. In addition, the same material as that of the protective layer 102 in Embodiment 1 can be used for the protective layer 202. Embodiment 1 can be referred to for the details thereof.

Note that it is preferable that a single crystal semiconductor substrate of silicon or the like be used as the substrate 200 including a semiconductor material because high-speed reading operation in the semiconductor device is possible.

Next, part of the substrate 200 in a region that is not covered with the protective layer 202 (i.e., an exposed region) is removed by etching with the use of the protective layer 202 as a mask. Thus, a semiconductor region 204 which is apart from another semiconductor region is formed (see FIG. 10B). As the etching, dry etching is preferably performed, but wet etching can be performed. An etching gas and an etchant can be selected as appropriate depending on a material of layers to be etched.

Figure 10C:
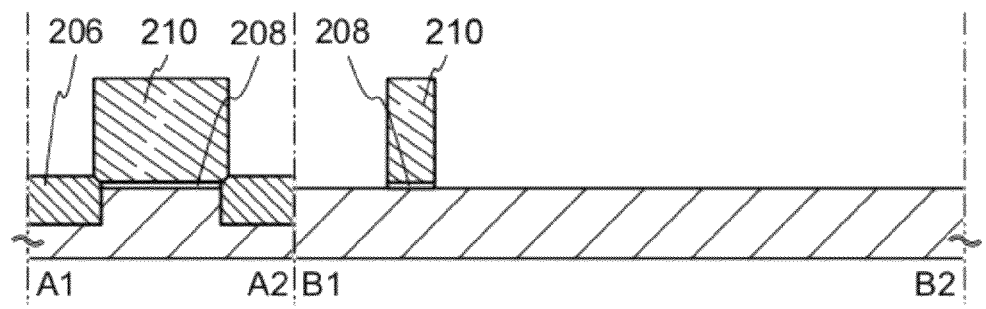

Then, an insulating layer is formed so as to cover the semiconductor region 204, and the insulating layer in a region overlapping with the semiconductor region 204 is selectively removed, so that the element isolation insulating layer 206 is formed (see FIG. 10C). The element isolation insulating layer 206 can be formed using a material and a method similar to those of the element isolation insulating layer 106 in Embodiment 1. Therefore, Embodiment 1 can be referred to for the details thereof.

Next, an insulating layer is formed over a surface of the semiconductor region 204, and a layer containing a conductive material is formed over the insulating layer. After that, the insulating layer and the layer containing a conductive material are selectively etched, so that the gate insulating layer 208 and the gate electrode 210 are formed (see FIG. 10C). The gate insulating layer 208 and the gate electrode 210 can be formed using materials and methods similar to those of the gate insulating layer 108 and the gate electrode 110 in Embodiment 1. Therefore, Embodiment 1 can be referred to for the details thereof.

Figure 10D:
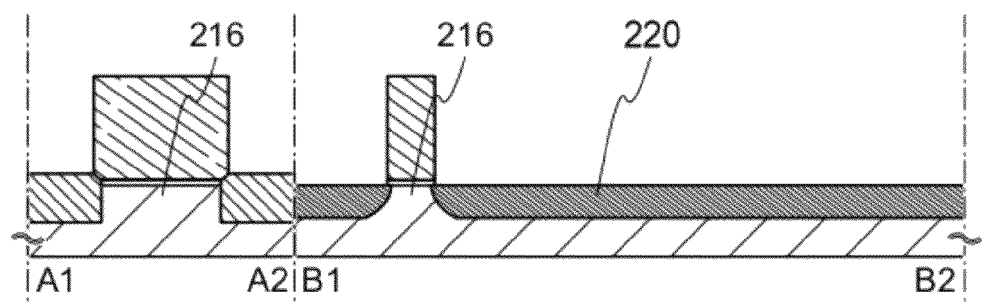

Next, phosphorus (P), arsenic (As), or the like is added to the semiconductor region 204, so that the channel formation region 216 and the impurity regions 220 are formed (see FIG. 10D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably increased when the size of a semiconductor element is extremely decreased.

Note that a sidewall insulating layer may be formed in the periphery of the gate electrode 210 so that an impurity region to which an impurity element is added at a different concentration may be formed.

Next, a metal layer 222 is formed so as to cover the gate electrode 210, the impurity regions 220, and the like. Then, heat treatment is performed so that the metal layer 222 and a semiconductor material react to each other, whereby the metal compound regions 224 in contact with the impurity regions 220 are formed (see FIG. 11A). The metal layer 222 and the metal compound regions 224 can be formed using materials and methods similar to those of the metal layer 122 and the metal compound regions 124 in Embodiment 1. Therefore, Embodiment 1 can be referred to for the details thereof. The formation of the metal compound regions can properly reduce the electric resistance and improve element characteristics.

Figure 11A:
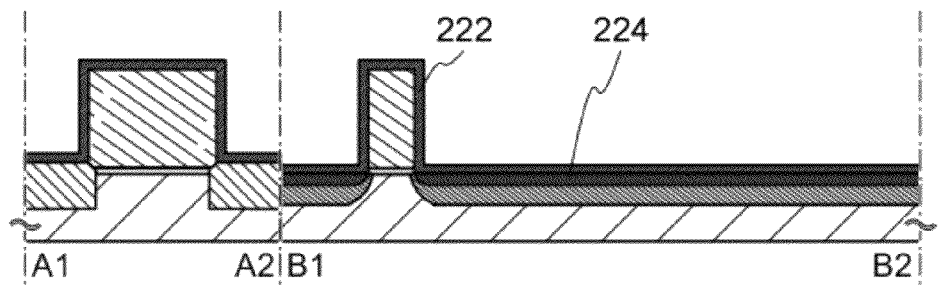
FIGS. 11A to 11C are cross-sectional views according to the process for manufacturing a semiconductor device.
Figure 11B:
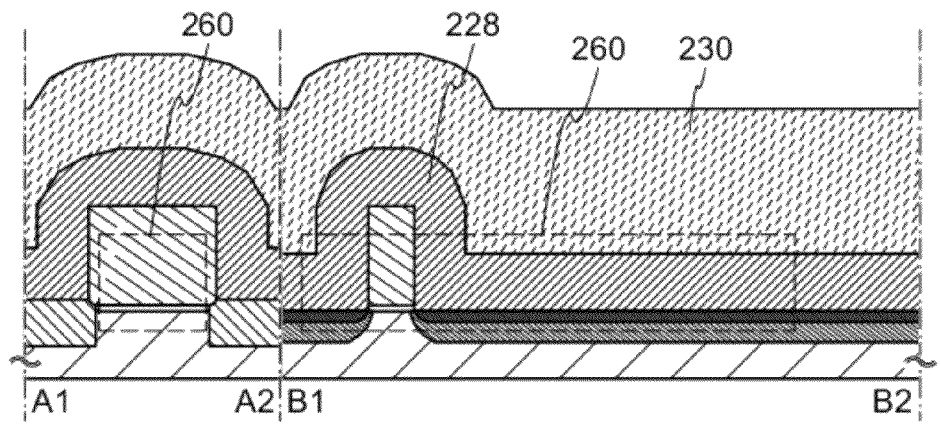

Then, the insulating layer 228 and the insulating layer 230 are formed so as to cover the components formed in the above steps (see FIG. 11B). The insulating layer 228 and the insulating layer 230 can be formed using a material including an inorganic insulating material such as silicon oxide, silicon oxynitride, or aluminum oxide. In particular, the insulating layer 228 and the insulating layer 230 are preferably formed using a low dielectric constant (low-k) material, whereby capacitance caused by an overlap of electrodes or wirings can be sufficiently reduced. Note that a porous insulating layer including these materials may be used for the insulating layer 228 and the insulating layer 230. Since the porous insulating layer has low dielectric constant as compared to a dense insulating layer, capacitance due to electrodes or wirings can be further reduced.

In addition, a layer including an inorganic material containing a large amount of nitride, such as silicon nitride oxide or silicon nitride, may be included in the insulating layer 228 or the insulating layer 230. Thus, the impurity such as water or hydrogen contained in the material included in the transistor 260 in the lower portion can be prevented from entering the oxide semiconductor layer 244 of the transistor 262 in the upper portion that is formed later. Note that in this case, it is difficult to remove the layer including an inorganic insulating material containing a large amount of nitrogen only by CMP treatment performed in a later step; therefore, CMP treatment and etching treatment are preferably performed in combination.

For example, silicon oxynitride and silicon oxide are used for forming the insulating layer 228 and the insulating layer 230, respectively. In this manner, only an inorganic insulating material containing a large amount of oxygen, such as silicon oxynitride or silicon oxide, is used for the insulating layer 228 and the insulating layer 230, whereby CMP treatment can be easily performed on the insulating layer 228 and the insulating layer 230 in a later step.

Note that a stacked structure of the insulating layer 228 and the insulating layer 230 is employed here; however, one embodiment of the disclosed invention is not limited to this. A single-layer structure or a stacked structure including three or more layers can also be used. For example, the following structure may be employed: silicon oxynitride and silicon oxide are used for the insulating layer 228 and the insulating layer 230, respectively, and a silicon nitride oxide film is formed between the insulating layer 228 and the insulating layer 230.

Through the above steps, the transistor 260 using the substrate 200 including a semiconductor material is formed (see FIG. 11B). Such a transistor 260 is capable of high-speed operation. Therefore, when the transistor 260 is used as a reading transistor, data can be read out at high speed.

Figure 11C:
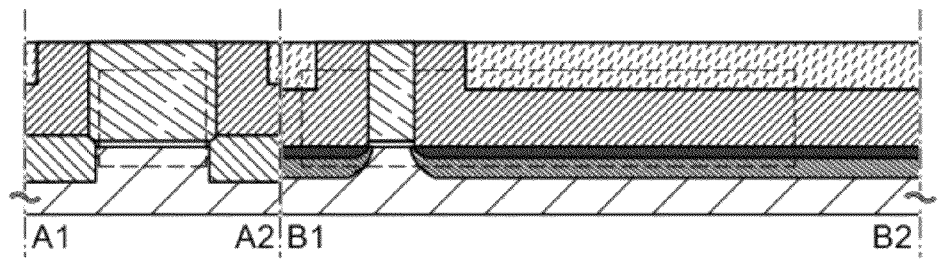

After that, as treatment before formation of the transistor 262, CMP treatment is performed on the insulating layer 228 and the insulating layer 230, so that surfaces of the insulating layer 228 and the insulating layer 230 are planarized and a top surface of the gate electrode 210 is exposed (see FIG. 11C).

The CMP treatment may be performed once or plural times. When the CMP treatment is performed plural times, first polishing is preferably performed with a high polishing rate followed by final polishing with a low polishing rate. By combining polishing with different polishing rates, planarity of the surfaces of the insulating layer 228 and the insulating layer 230 can be further improved.

As the treatment for planarizing the insulating layer 228 and the insulating layer 230, etching treatment or the like can be performed instead of CMP treatment, and planarization is preferably performed so that each of the surfaces of the insulating layer 228 and the insulating layer 230 has an RMS roughness of less than or equal to 1 nm, or preferably less than or equal to 0.5 nm in order to improve the planarity and the uniformity of the oxide semiconductor layer 244 and improve characteristics of the transistor 262.

In addition, when the stacked layer structure of the insulating layer 228 and the insulating layer 230 includes an inorganic insulating material containing a large amount of nitrogen, such as silicon nitride or silicon nitride oxide, since it is difficult to remove the inorganic insulating material containing a large amount of nitrogen only by the CMP treatment, CMP treatment and etching treatment are preferably performed in combination. As the etching treatment for the inorganic insulating material containing a large amount of nitrogen, either dry etching or wet etching may be used. However, in view of miniaturization of elements, dry etching is preferably used. In addition, it is preferable that etching conditions (an etching gas, an etchant, an etching time, a temperature, or the like) be set appropriately so that etching rates of the respective insulating layers are equal to each other and high etching selectivity with the gate electrode 210 can be obtained. In addition, as an etching gas for dry etching, for example, a gas containing fluorine (trifluoromethane ($CHF_3$)), a gas to which a rare gas such as helium (He) or argon (Ar) is added, or the like can be used.

In addition, when the top surface of the gate electrode 210 is exposed from the insulating layer 230, the top surface of the gate electrode 210 and a surface of the insulating layer 230 are included in the same surface.

Note that before or after the above steps, a step for forming an additional electrode, wiring, semiconductor layer, or insulating layer may be performed. For example, an electrode which is connected to part of the metal compound region 224 and functions as a source or drain electrode of the transistor 260 may be formed. In addition, a multilayer wiring structure in which an insulating layer and a conductive layer are stacked is employed as a wiring structure, so that a highly-integrated semiconductor device can be provided.

<Method for Manufacturing Transistor in Upper Portion>

Figure 12A:
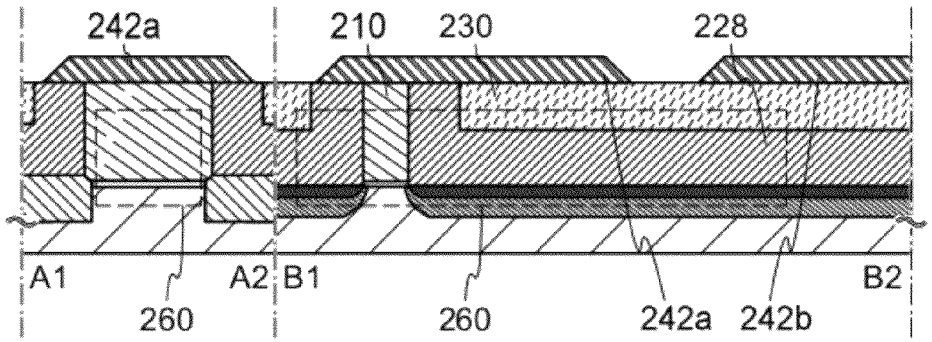
FIGS. 12A to 12D are cross-sectional views according to the process for manufacturing a semiconductor device.

Then, a conductive layer is formed over the gate electrode 210, the insulating layer 228, the insulating layer 230, and the like, and the conductive layer is selectively etched, so that the source or drain electrode 242a and the source or drain electrode 242b are formed (see FIG. 12A). The source or drain electrode 242a and the source or drain electrode 242b can be formed using a material and a method similar to those of the source or drain electrode 142a and the source or drain electrode 142b in Embodiment 1. Therefore, Embodiment 1 can be referred to for the details thereof.

Here, the edge portions of the source or drain electrode 242a and the source or drain electrode 242b are etched so as to be tapered; accordingly, the coverage of the gate insulating layer 246 to be formed later is improved and breaking can be prevented.

The channel length (L) of the transistor in the upper portion is determined by a distance between a lower edge portion of the source or drain electrode 242a and a lower edge portion of the source or drain electrode 242b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Here, the source or drain electrode 242a of the transistor 262 and the gate electrode 210 of the transistor 260 are directly connected to each other (see FIG. 12A). When the gate electrode 210 and the source or drain electrode 242a are directly connected to each other, higher integration of the semiconductor device can be achieved as compared to the case where an opening and an electrode for connection are separately formed so that the gate electrode 210 is connected to the source or drain electrode 242a because a contact area can be reduced. Accordingly, a storage capacity per unit area of the semiconductor device which can be used as a memory device can be increased. In addition, a step necessary for forming an opening and an electrode which are separately formed for the contact can be omitted; therefore, a process for manufacturing a semiconductor device can be simplified.

Figure 12B:
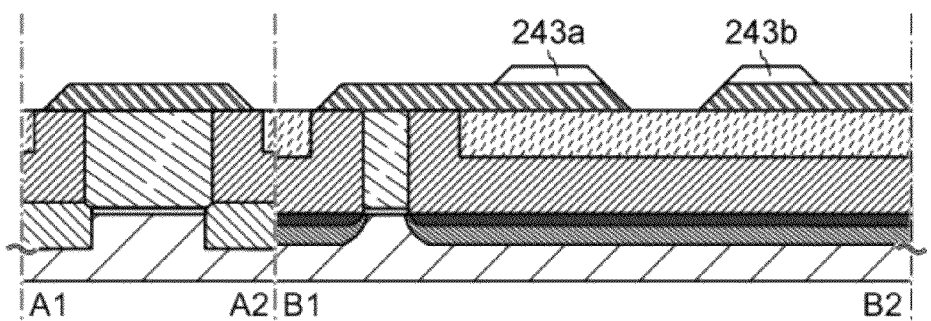

Then, the insulating layer 243a and the insulating layer 243b are formed over the source or drain electrode 242a and the source or drain electrode 242b, respectively (see FIG. 12B). The insulating layer 243a and the insulating layer 243b can be formed using a material and a method similar to those of the insulating layer 143a and the insulating layer 143b in Embodiment 1. Accordingly, Embodiment 1 can be referred to for the details thereof. By providing the insulating layer 243a and the insulating layer 243b, capacitance between the gate electrode and the source or drain electrode can be reduced.

Note that in view of reduction in the capacitance between the gate electrode and the source or drain electrode, the insulating layer 243a and the insulating layer 243b are preferably formed; however, a structure without the insulating layer 243a and the insulating layer 243b may be employed.

Figure 12C:
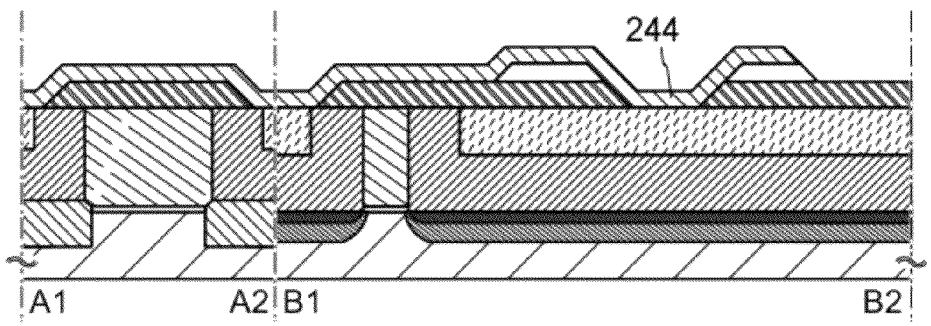

Next, an oxide semiconductor layer is formed so as to cover the source or drain electrode 242a and the source or drain electrode 242b, and then the oxide semiconductor layer is selectively etched, so that the oxide semiconductor layer 244 is formed (see FIG. 12C). The oxide semiconductor layer 244 can be formed using a material and a method similar to those of the oxide semiconductor layer 144 described in Embodiment 1. Embodiment 1 can be referred to for the details.

Here, the oxide semiconductor layer 244 is provided over the insulating layer 230 including a surface whose RMS roughness is less than or equal to 1 nm, preferably less than or equal to 0.5 nm. In this manner, by providing the oxide semiconductor layer 244 over the surface with favorable planarity, favorable planarity and uniformity of the oxide semiconductor layer 244 can be obtained. In addition, by using the oxide semiconductor layer 244 with favorable planarity and uniformity, transistor characteristics of the transistor 262 can be improved.

Note that, as described in Embodiment 1, before the oxide semiconductor layer is formed by a sputtering method, reverse sputtering in which plasma is generated with an argon gas introduced is preferably performed, so that dust attached to a surface on which the oxide semiconductor layer is formed (e.g., the surface of the insulating layer 230) is removed.

After that, heat treatment (first heat treatment) is preferably performed on the oxide semiconductor layer. The heat treatment (the first heat treatment) can be performed in a similar manner to that in Embodiment 1.

Impurities are reduced by the first heat treatment so that the i-type (intrinsic) or substantially i-type oxide semiconductor layer is obtained. Accordingly, a transistor having significantly excellent characteristics can be realized.

Note that the oxide semiconductor layer may be etched either before or after the heat treatment. In view of miniaturization of elements, dry etching is preferably used; however, wet etching may be used. An etching gas and an etchant can be selected as appropriate depending on a material of layers to be etched. Note that in the case where leakage current in an element does not cause a problem, the oxide semiconductor layer may be used without being processed to have an island shape.

Figure 12D:
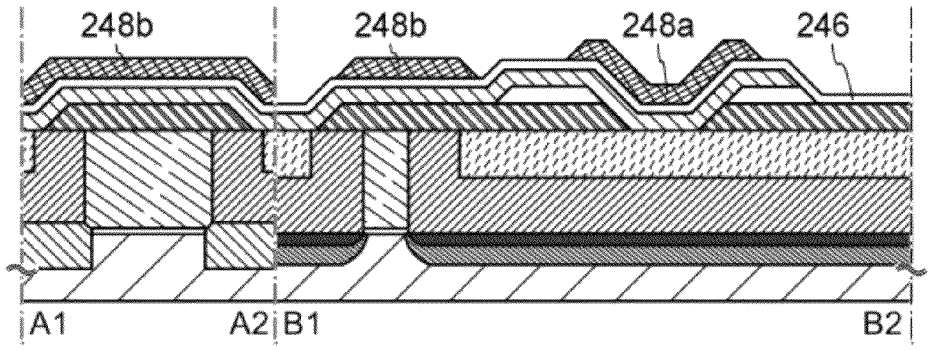

Next, the gate insulating layer 246 in contact with the oxide semiconductor layer 244 is formed, and then the gate electrode 248a and the electrode 248b are formed in regions overlapping with the oxide semiconductor layer 244 and the source or drain electrode 242a, respectively, over the gate insulating layer 246 (see FIG. 12D). The gate insulating layer 246 can be formed using a material and a method similar to those of the gate insulating layer 146 in Embodiment 1.

After the gate insulating layer 246 is formed, second heat treatment is desirably performed in an inert gas atmosphere or an oxygen atmosphere. The second heat treatment can be performed in a similar manner to that in Embodiment 1. The second heat treatment can reduce variation in electrical characteristics of the transistor. Further, in the case where the gate insulating layer 246 contains oxygen, oxygen is supplied to the oxide semiconductor layer 244 to cover oxygen deficiency in the oxide semiconductor layer 244, so that an i-type (intrinsic semiconductor) or substantially i-type oxide semiconductor layer can be formed.

Note that in this embodiment, the second heat treatment is performed after the gate insulating layer 246 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is performed, so that the oxide semiconductor layer 244 can be highly purified so as to contain impurities which are not main components as little as possible.

The gate electrode 248a can be formed using a material and a method similar to those of the gate electrode 148a in Embodiment 1. In addition, the electrode 248b can be formed by selectively etching the conductive layer, at the same time as the formation of the gate electrode 248a. Embodiment 1 can be referred to for the details thereof.

Figure 13A:
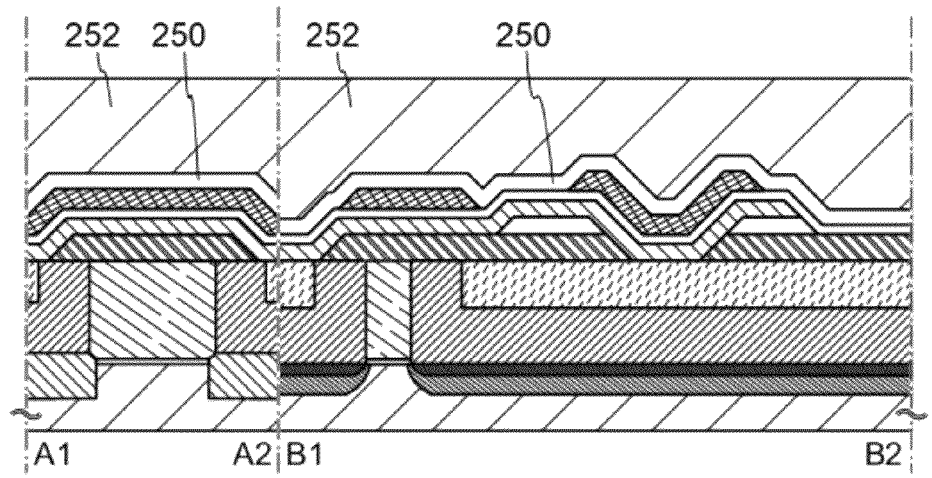
FIGS. 13A to 13C are cross-sectional views according to the process for manufacturing a semiconductor device.

Next, the insulating layer 250 and the insulating layer 252 are formed over the gate insulating layer 246, the gate electrode 248a, and the electrode 248b (see FIG. 13A). The insulating layer 250 and the insulating layer 252 can be formed using materials and methods similar to those of the insulating layer 150 and the insulating layer 152 in Embodiment 1. Accordingly, Embodiment 1 can be referred to for the details thereof.

Figure 13B:
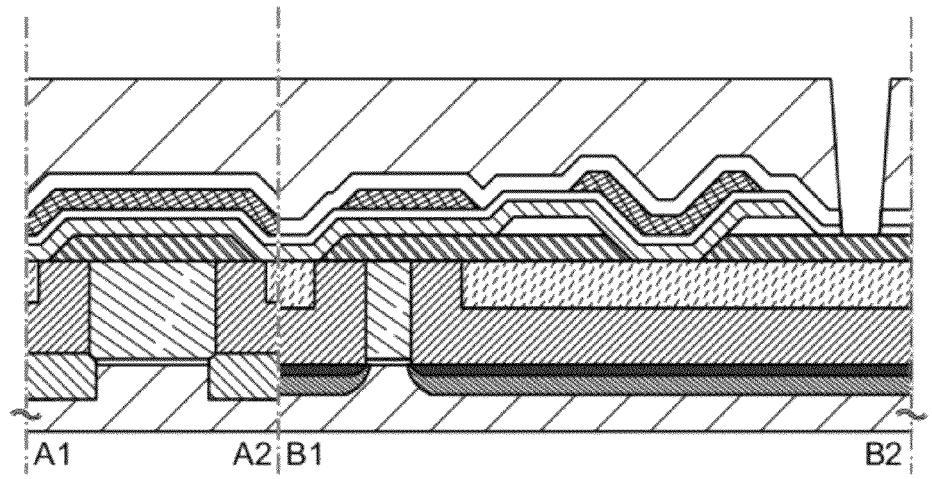

Next, an opening which reaches the source or drain electrode 242b through the gate insulating layer 246, the insulating layer 250 and the insulating layer 252 is formed (see FIG. 13B). The opening is formed by selective etching with the use of a mask or the like.

Figure 13C:
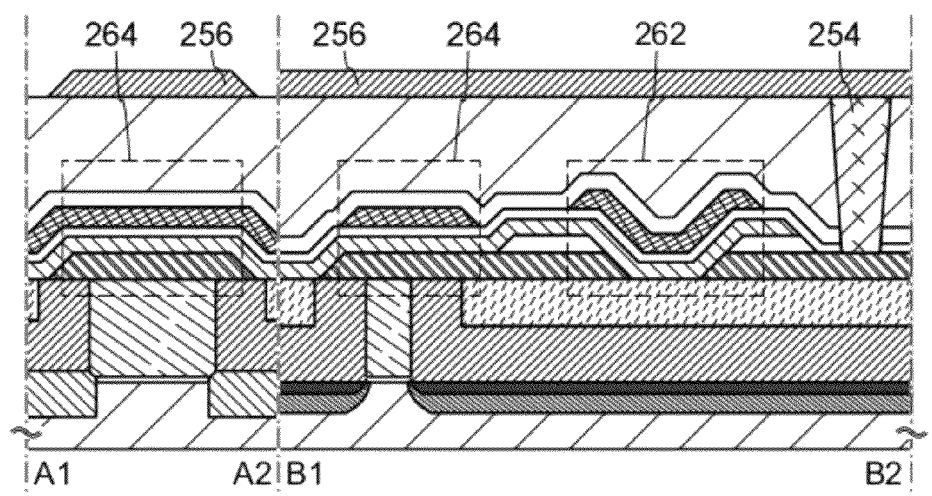

Then, the electrode 254 is formed in the opening, and the wiring 256 in contact with the electrode 254 is formed over the insulating layer 252 (see FIG. 13C).

For example, the electrode 254 can be formed in the following manner: a conductive layer is formed in a region including the opening by a PVD method, a CVD method, or the like, and then, the conductive layer is partly removed by etching treatment, CMP, or the like.

Specifically, it is possible to employ a method, for example, in which a thin titanium film is formed in a region including the opening by a PVD method and a thin titanium nitride film is formed by a CVD method, and then, a tungsten film is formed so as to be embedded in the opening. Here, the titanium film formed by a PVD method has a function of reducing an oxide film (e.g., a natural oxide film) formed on a surface over which the titanium film is formed, to decrease the contact resistance with the lower electrode (here, the source or drain electrode 242b) or the like. The titanium nitride film formed after the formation of the titanium film has a barrier function of preventing diffusion of the conductive material. A copper film may be formed by a plating method after the formation of the barrier film of titanium, titanium nitride, or the like.

Note that in the case where the electrode 254 is formed by removing part of the conductive layer, it is preferable that a surface thereof be processed to be flat. For example, when a thin titanium film or a thin titanium nitride film is formed in a region including the opening and then a tungsten film is formed so as to be embedded in the opening, excess tungsten, titanium, titanium nitride, or the like can be removed and the planarity of the surface can be improved by subsequent CMP treatment. The surface including the surface of the electrode 254 is planarized in such a manner, whereby an electrode, a wiring, an insulating layer, a semiconductor layer, and the like can be favorably formed in later steps.

The wiring 256 can be formed using a material and a method similar to those of the wiring 156 in Embodiment 1. Accordingly, Embodiment 1 can be referred to for the details thereof.

Through the above steps, the transistor 262 including the highly-purified oxide semiconductor layer 244 and the capacitor 264 are completed (see FIG. 13C).

With the use of the highly-purified intrinsic oxide semiconductor layer 244, the off current of the transistor can be sufficiently reduced. Then, by using such a transistor, a semiconductor device in which stored data can be held for an extremely long time can be obtained.

In this manner, the semiconductor device in which the transistor including a semiconductor material other than an oxide semiconductor is included in the lower portion and the transistor including an oxide semiconductor is included in the upper portion, and which can be used as a memory device can be provided.

With a combination of the transistor including an oxide semiconductor and the transistor including a semiconductor material other than an oxide semiconductor, the semiconductor device capable of holding data for a long time and reading data at high speed, which can be used as a memory device, can be obtained.

In addition, by providing the oxide semiconductor layer over a surface with favorable planarity, the semiconductor device in which the transistor whose transistor characteristics are improved is stacked over the transistor including a semiconductor material other than an oxide semiconductor can be provided.

When the gate electrode 210 and the source or drain electrode 242a are directly connected to each other, higher integration of the semiconductor device can be achieved because a contact area can be reduced. Accordingly, a storage capacity per unit area of the semiconductor device which can be used as a memory device can be increased.

The structures, methods, and the like described in this embodiment can be combined as appropriate with any of the structures, methods, and the like described in the other embodiments.

Embodiment 3

In this embodiment, a structure and a manufacturing method of a semiconductor device according to an embodiment of the disclosed invention will be described with reference to FIGS. 14A and 14B, FIGS. 15A to 15H, and FIGS. 16A to 16E. In particular, an example of a structure of a semiconductor device which can be used as a memory device will be described in this embodiment.

<Cross-Sectional Structure and Planar Structure of Semiconductor Device>

Figure 14A:
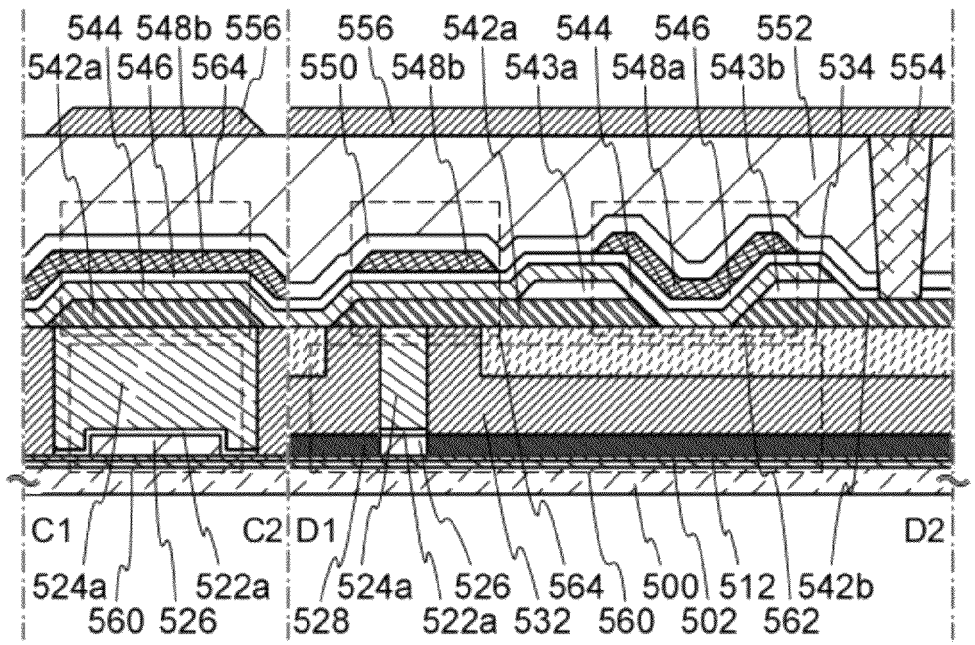
FIGS. 14A and 14B are a cross-sectional view and a plan view of a semiconductor device.
Figure 14B:
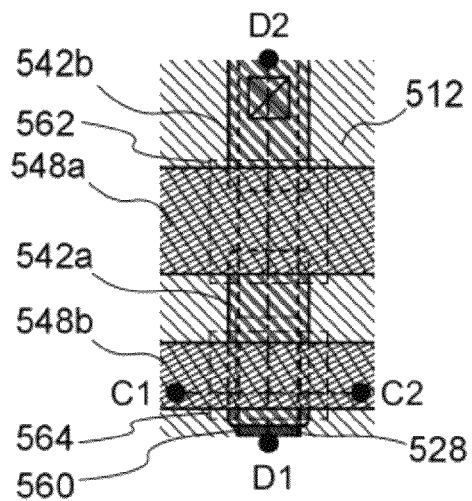

FIGS. 14A and 14B illustrate an example of a structure of the semiconductor device according to this embodiment. FIGS. 14A and 14B illustrate a cross-sectional view and a plan view of the semiconductor device, respectively. Here, FIG. 14A corresponds to a cross section along line C1-C2 and line D1-D2 in FIG. 14B. In the semiconductor device illustrated in FIGS. 14A and 14B, a transistor 560 including a first semiconductor material is provided in a lower portion, a transistor 562 including a second semiconductor material is provided in an upper portion, and a gate electrode 524a of the transistor 560 and a source or drain electrode 542a of the transistor 562 are directly connected to each other. Here, the first semiconductor material is preferably different from the second semiconductor material. For example, a semiconductor material other than an oxide semiconductor (e.g., silicon), can be used as the first semiconductor material and an oxide semiconductor can be used as the second semiconductor material. The transistor 560 including a semiconductor material other than an oxide semiconductor can operate at high speed easily. On the other hand, the transistor 562 including an oxide semiconductor has off current which is sufficiently reduced, so that the transistor 562 can hold charge for a long time.

Therefore, when the transistor 562 is in an off state, the potential of the gate electrode 524a of the transistor 560 can be held for an extremely long time. When a capacitor 564 is provided, electric charge supplied to the gate electrode 524a of the transistor 560 can be held easily and reading of held data can be performed easily. In addition, since the transistor 560 including such a semiconductor material is capable of operating at sufficiently high speed, reading speed of data can be improved.

Although all the transistors are n-channel transistors here, it is needless to say that p-channel transistors can be used. The technical nature of the disclosed invention is that a transistor including an oxide semiconductor with sufficiently reduced off current and a transistor including a semiconductor material other than an oxide semiconductor which is capable of sufficiently high-speed operation are provided in combination; thus, it is not necessary to limit specific conditions, such as a material used for the semiconductor device or a structure of the semiconductor device, to the structure described here.

The transistor 560 illustrated in FIGS. 14A and 14B includes a channel formation region 526 provided in a semiconductor layer over a base substrate 500, impurity regions 528 with the channel formation region 526 provided therebetween, a gate insulating layer 522a provided over the channel formation region 526, and the gate electrode 524a provided over the gate insulating layer 522a. That is, a difference between the transistor 560 in FIGS. 14A and 14B and the transistor 260 in FIGS. 6A and 6B is whether or not the channel formation region of the transistor is formed in the semiconductor layer over the base substrate. It can also be said that the difference lies in the use of a semiconductor substrate or an SOI substrate. Note that a transistor whose source electrode and drain electrode are not illustrated in a drawing may be referred to as a transistor for the sake of convenience.

In addition, an insulating layer 532 and an insulating layer 534 are provided so as to cover the transistor 560. Although not shown, part of the impurity region 528 of the transistor 560 is connected to a wiring 556 or another wiring via electrodes functioning as a source electrode and a drain electrode. Note that in order to obtain high integration, the transistor 560 preferably does not have a sidewall insulating layer as illustrated in FIGS. 14A and 14B. On the other hand, in the case where characteristics of the transistor 560 are emphasized, a sidewall insulating layer may be provided on a side surface of the gate electrode 524a and the impurity regions 528 may include an impurity region having a different impurity concentration provided in a region overlapping with the sidewall insulating layer.

The transistor 562 in FIGS. 14A and 14B has the same structure as the transistor 262 in FIGS. 6A and 6B. In other words, the transistor 562 in FIGS. 14A and 14B includes the source or drain electrode 542a and a source or drain electrode 542b which are provided over the insulating layer 534; an oxide semiconductor layer 544 electrically connected to the source or drain electrode 542a and the source or drain electrode 542b; a gate insulating layer 546 covering the source or drain electrode 542a, the source or drain electrode 542b, and the oxide semiconductor layer 544; a gate electrode 548a provided to overlap with the oxide semiconductor layer 544, over the gate insulating layer 546; an insulating layer 543a provided in a region between the source or drain electrode 542a and the oxide semiconductor layer 544, which overlaps with the gate electrode 548a; and an insulating layer 543b provided in a region between the source or drain electrode 542b and the oxide semiconductor layer 544, which overlaps with the gate electrode 548a. Note that in order to reduce capacitance between the source electrode or the drain electrode and the gate electrode, it is preferable to provide the insulating layer 543a and the insulating layer 543b. However, alternatively, a structure without the insulating layer 543a and the insulating layer 543b may be employed. The above embodiments can also be referred to for the other details.

Here, the oxide semiconductor layer 544 is provided over the insulating layer 534 including a surface whose RMS roughness is less than or equal to 1 nm, preferably less than or equal to 0.5 nm. In this manner, by providing the oxide semiconductor layer 544 over the surface with favorable planarity, favorable planarity and uniformity of the oxide semiconductor layer 544 can be obtained.

By using the oxide semiconductor layer 544 with favorable planarity and uniformity, carrier scattering can be prevented and an interface level can be reduced at an interface with the oxide semiconductor layer. Accordingly, improvement in mobility, reduction in an S-value and off current, and improvement in transistor characteristics are possible in the transistor 562. In addition, improvement in the planarity of the oxide semiconductor layer 544 leads to reduction in gate leakage current of the transistor 562.

Further, the capacitor 564 in FIGS. 14A and 14B has the same structure as the capacitor 264 in FIGS. 6A and 6B. In other words, the capacitor 564 in FIGS. 14A and 14B includes the source or drain electrode 542a, the oxide semiconductor layer 544, the gate insulating layer 546, and an electrode 548b. That is, the source or drain electrode 542a functions as one electrode of the capacitor 564, and the electrode 548b functions as the other electrode of the capacitor 564. The above embodiments can also be referred to for the other details.

The following structures in FIGS. 14A and 14B are also similar to those in FIGS. 6A and 6B: an insulating layer 550 is provided over the transistor 562 and the capacitor 564; an insulating layer 552 is provided over the insulating layer 550; an electrode 554 is provided in an opening formed in the gate insulating layer 546, the insulating layer 550, the insulating layer 552, and the like; and the wiring 556 connected to the electrode 554 is provided over the insulating layer 552.

Note that the structure of the semiconductor device according to this embodiment is not limited to that of the semiconductor in FIGS. 14A and 14B. For example, instead of the transistor 562 and the capacitor 564, the transistor 272 and the capacitor 274 illustrated in FIGS. 7A and 7B may be used, the transistor 282 and the capacitor 284 illustrated in FIGS. 8A and 8B may be used, or the transistor 292 and the capacitor 294 illustrated in FIGS. 9A and 9B may be used.

<Method for Manufacturing SOI Substrate>

Next, an example of a method for manufacturing an SOI substrate used for manufacturing the semiconductor device will be described with reference to FIGS. 15A to 15H.

First, the base substrate 500 is prepared (see FIG. 15A). As the base substrate 500, a substrate formed using an insulator can be used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Further, a ceramic substrate which contains silicon nitride and aluminum nitride as its main components and whose coefficient of thermal expansion is close to that of silicon may be used.

Alternatively, a semiconductor substrate such as a single crystal silicon substrate or a single crystal germanium substrate may be used as the base substrate 500. In the case of using such a semiconductor substrate as the base substrate 500, the temperature limitation for heat treatment can be raised compared with the case of using a glass substrate or the like; thus, a high-quality SOI substrate is easily obtained. Here, as a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Note that in this embodiment, a description is given of the case where a glass substrate is used as the base substrate 500. Cost reduction can be achieved when a glass substrate which can have a larger size and is inexpensive is used as the base substrate 500.

A surface of the base substrate 500 is preferably cleaned in advance. Specifically, the base substrate 500 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. Through such cleaning treatment, the surface planarity of the base substrate 500 can be improved and abrasive particles left on the surface of the base substrate 500 can be removed.

Then, a nitrogen-containing layer 502 (e.g., a layer including an insulating film containing nitrogen, such as a silicon nitride ($SiN_x$) film or a silicon nitride oxide ($SiN_xO_y$ (x>y)) film) is formed over the surface of the base substrate 500 (see FIG. 15B). The nitrogen-containing layer 502 can be formed by a CVD method, a sputtering method, or the like.

The nitrogen-containing layer 502 formed in this embodiment corresponds to a layer for bonding a single crystal semiconductor layer (a bonding layer). The nitrogen-containing layer 502 also functions as a barrier layer for preventing impurity contained in the base substrate, such as sodium (Na), from diffusing into the single crystal semiconductor layer.

As described above, since the nitrogen-containing layer 502 is used as the bonding layer in this embodiment, it is preferable that the nitrogen-containing layer 502 be formed to have a certain level of surface planarity. Specifically, the nitrogen-containing layer 502 is formed such that it has an average surface roughness (Ra, which is also referred to as arithmetic mean deviation) of 0.5 nm or less and an RMS roughness of 0.60 nm or less, preferably Ra of 0.35 nm or less and an RMS of 0.45 nm or less. Note that for the above average surface roughness or the root-mean-square surface roughness, for example, a value obtained by the measurement performed on a region of 10 μm×10 μm can be used. The thickness is in the range of from 10 nm to 200 nm, preferably, from 50 nm to 100 nm. With the surface planarity improved as described above, the bonding defect of the single crystal semiconductor layer can be prevented.

Next, a bonding substrate is prepared. Here, a single crystal semiconductor substrate 510 is used as the bonding substrate (see FIG. 15C). Note that although a substrate whose crystallinity is single crystal is used as the bonding substrate here, the crystallinity of the bonding substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a floating zone (FZ) method.

An oxide film 512 is formed over a surface of the single crystal semiconductor substrate 510 (see FIG. 15D). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Alternatively, diluted hydrofluoric acid and ozone water may be discharged alternately to clean the surface of the single crystal semiconductor substrate 510.

The oxide film 512 can be formed with, for example, a single layer or a stacked layer of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced. Moreover, after the bonding to the base substrate 500, impurity from the base substrate, such as Na, can be fixed, so that contamination of the single crystal semiconductor substrate 510 can be prevented.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Next, ions are accelerated by an electric field and the single crystal semiconductor substrate 510 is irradiated and added with the ions, whereby an embrittled region 514 where the crystal structure is damaged is formed in the single crystal semiconductor substrate 510 at a predetermined depth (see FIG. 15E).

The depth at which the embrittled region 514 is formed can be controlled by the kinetic energy, mass, charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be controlled such that the thickness of a single crystal semiconductor layer is approximately 10 nm to 500 nm, preferably, 50 nm to 200 nm.

The above ion irradiation treatment can be performed with an ion-doping apparatus or an ion-implantation apparatus. As a typical example of the ion-doping apparatus, there is a non-mass-separation apparatus in which plasma excitation of a process gas is performed and an object to be processed is irradiated with all kinds of ion species generated. In this apparatus, the object to be processed is irradiated with ion species of plasma without mass separation. In contrast, an ion-implantation apparatus is a mass-separation apparatus. In the ion-implantation apparatus, mass separation of ion species of plasma is performed and the object to be processed is irradiated with ion species having predetermined masses.

In this embodiment, an example will be described in which an ion-doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H_3^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared with the case of performing irradiation of hydrogen and helium in different steps, and an increase in surface roughness of a single crystal semiconductor layer to be formed later can be suppressed.

Note that heavy metal may also be added when the embrittled region 514 is formed with the ion doping apparatus; however, the ion irradiation is performed through the oxide film 512 containing halogen atoms, whereby contamination of the single crystal semiconductor substrate 510 due to the heavy metal can be prevented.

Then, the base substrate 500 and the single crystal semiconductor substrate 510 are disposed to face each other and a surface of the nitrogen-containing layer 502 and a surface of the oxide film 512 are disposed in close contact with each other. Thus, the base substrate 500 and the single crystal semiconductor substrate 510 are bonded to each other (see FIG. 15F).

When bonding is performed, it is preferable that a pressure greater than or equal to 0.001 $N/cm^2$ and less than or equal to 100 N/cm$^2$, e.g., a pressure greater than or equal to 1 N/cm$^2$ and less than or equal to 20 N/cm$^2$, be applied to one part of the base substrate 500 or one part of the single crystal semiconductor substrate 510. When the bonding surfaces are made close to each other and disposed in close contact with each other by applying a pressure, a bonding between the nitrogen-containing layer 502 and the oxide film 512 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 510 and the base substrate 500 are bonded to each other, surfaces to be bonded to each other are preferably subjected to surface treatment. Surface treatment can improve the bonding strength at the interface between the single crystal semiconductor substrate 510 and the base substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature higher than or equal to room temperature and lower than 400° C.). Alternatively, bonding of the nitrogen-containing layer 502 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Next, heat treatment is performed for separation of the single crystal semiconductor substrate 510 at the embrittled region, whereby a single crystal semiconductor layer 516 is formed over the base substrate 500 with the nitrogen-containing layer 502 and the oxide film 512 provided therebetween (see FIG. 15G).

Note that the temperature for heat treatment in the separation is preferably as low as possible. This is because as the temperature in the separation is low, generation of roughness on the surface of the single crystal semiconductor layer 516 can be suppressed. Specifically, the temperature for the heat treatment in the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 510 is separated, the single crystal semiconductor layer 516 may be subjected to heat treatment at 500° C. or higher so that concentration of hydrogen remaining in the single crystal semiconductor layer 516 is reduced.

Next, a surface of the single crystal semiconductor layer 516 is irradiated with laser light, whereby a single crystal semiconductor layer 518 in which the planarity of the surface is improved and the number of defects is reduced is formed (see FIG. 15H). Note that instead of the laser light irradiation treatment, heat treatment may be performed.

Although the irradiation treatment with the laser light is performed just after the heat treatment for separation of the single crystal semiconductor layer 516 in this embodiment, one embodiment of the disclosed invention is not construed as being limited to this. Etching treatment may be performed after the heat treatment for separation of the single crystal semiconductor layer 516, to remove a region where there are many defects on the surface of the single crystal semiconductor layer 516, and then the laser light irradiation treatment may be performed. Alternatively, after the surface planarity of the single crystal semiconductor layer 516 is improved, the laser light irradiation treatment may be performed. Note that the etching treatment may be either wet etching or dry etching. Further, in this embodiment, a step of reducing the thickness of the single crystal semiconductor layer 516 may be performed after the laser light irradiation. In order to reduce the thickness of the single crystal semiconductor layer 516, any one or both of dry etching and wet etching may be employed.

Through the above steps, an SOI substrate including the single crystal semiconductor layer 518 with favorable characteristics can be obtained (see FIG. 15H).

<Method for Manufacturing Semiconductor Device>

Next, a method for manufacturing a semiconductor device with the use of the SOI substrate, in particular, a method for manufacturing the transistor 560 will be described with reference to FIGS. 16A to 16E. Note that FIGS. 16A to 16E illustrate part of the SOI substrate formed by the method illustrated in FIGS. 15A to 15H, and are cross-sectional views corresponding to FIG. 14A.

Figure 16A:
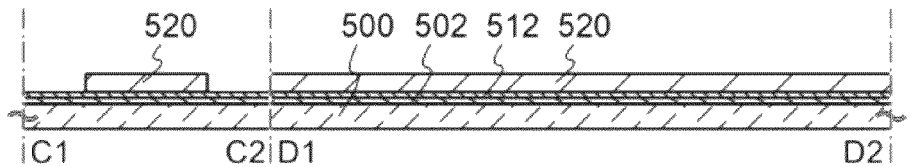
FIGS. 16A to 16E are cross-sectional views according to a process for manufacturing a semiconductor device.

First, the single crystal semiconductor layer 518 is patterned to have an island shape so that a semiconductor layer 520 is formed (see FIG. 16A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 16B:
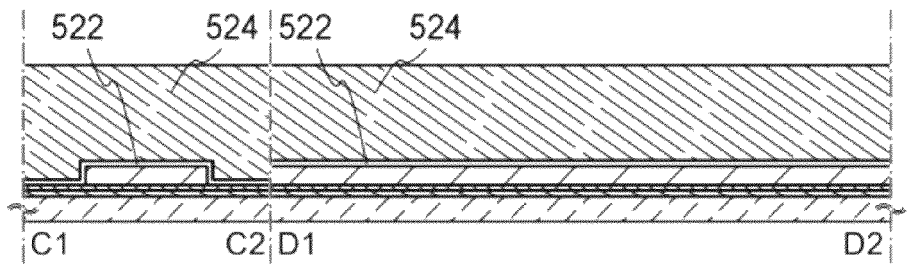

Next, an insulating layer 522 is formed so as to cover the semiconductor layer 520, and a conductive layer 524 is formed in a region overlapping with the semiconductor layer 520 over the insulating layer 522 (see FIG. 16B).

The insulating layer 522 is to be a gate insulating layer later. The insulating layer 522 can be formed, for example, by performing heat treatment (thermal oxidation treatment, thermal nitridation treatment, or the like) on a surface of the semiconductor layer 520. Instead of heat treatment, high-density plasma treatment may be employed. The high-density plasma treatment can be performed using, for example, a mixed gas of a rare gas such as He, Ar, Kr, or Xe and a gas such as oxygen, nitrogen oxide, ammonia, nitrogen, or hydrogen. Needless to say, the insulating layer may be formed using a CVD method, a sputtering method, or the like. The insulating layer preferably has a single-layer structure or a stacked structure using a film including any of silicon oxide, silicon oxynitride, silicon nitride oxide, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like formed by a CVD method, a sputtering method, or the like. The thickness of the insulating layer can be, for example, greater than or equal to 1 nm and less than or equal to 100 nm, preferably greater than or equal to 10 nm and less than or equal to 50 nm. Here, a single-layer insulating layer containing silicon oxide is formed using a plasma CVD method.

The conductive layer 524 is to be a gate electrode later. The conductive layer 524 can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

Figure 16C:
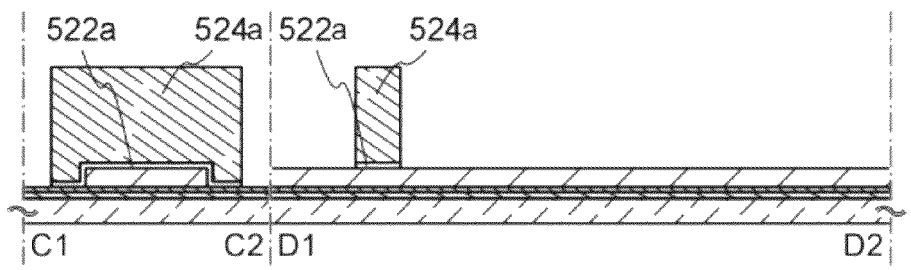

Next, the insulating layer 522 and the conductive layer 524 are selectively etched, so that the gate insulating layer 522a and the gate electrode 524a are formed above the semiconductor layer 520 (see FIG. 16C). As the etching, dry etching is preferably performed, but wet etching can be performed. An etching gas and an etchant can be selected as appropriate depending on a material of layers to be etched.

Figure 16D:
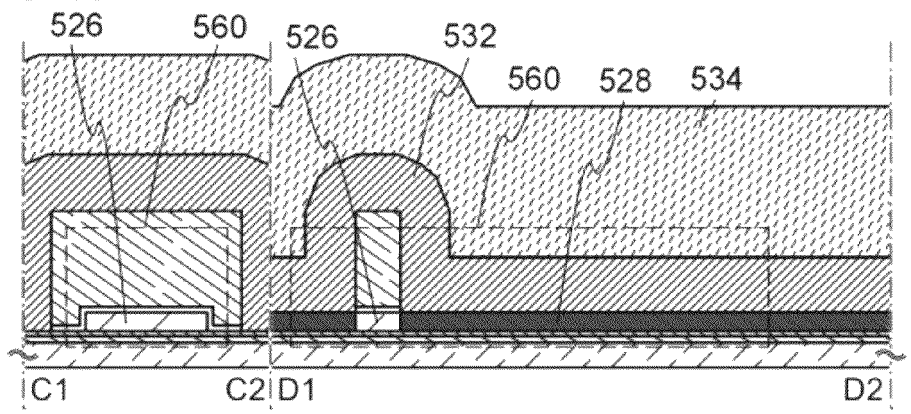

Then, the gate electrode 524a is used as a mask, and an impurity element imparting one conductivity type is added to the semiconductor layer 520, so that the channel formation region 526 and the impurity regions 528 are formed (see FIG. 16D). Note that phosphorus (P) or arsenic (As) is added here in order to form an n-channel transistor; an impurity element such as boron (B) or aluminum (Al) may be added in the case of forming a p-channel transistor. Here, the concentration of impurity to be added can be set as appropriate. In addition, after the impurity element is added, heat treatment for activation is performed.

Note that when the semiconductor layer 520 is formed using a material containing silicon, a silicide region may be formed by forming silicide in part of the semiconductor layer 520 in order to further reduce the resistance of the source region and the drain region. The silicide region is formed in such a manner that metal is brought into contact with the semiconductor layer, and silicon in the semiconductor layer is made to react with the metal by heat treatment (e.g., a GRTA method, an LRTA method, or laser irradiation). For the silicide region, for example, cobalt silicide, nickel silicide, or the like may be formed. In the case where the semiconductor layer 520 is thin, silicide reaction may proceed to a bottom of the semiconductor layer 520. As a metal material used for forming silicide, titanium, tungsten, molybdenum, zirconium, hafnium, tantalum, vanadium, neodymium, chromium, platinum, palladium, and the like can be given in addition to cobalt and nickel.

Next, the insulating layer 532 and the insulating layer 534 are formed so as to cover the components formed in the above steps (see FIG. 16D). The insulating layer 532 and the insulating layer 534 can be formed using a material including an inorganic insulating material such as silicon oxide, silicon oxynitride, or aluminum oxide. In particular, the insulating layer 532 and the insulating layer 534 are preferably formed using a low dielectric constant (low-k) material, whereby capacitance caused by an overlap of electrodes or wirings can be sufficiently reduced. Note that a porous insulating layer including these materials may be used for the insulating layer 532 and the insulating layer 534. Since the porous insulating layer has low dielectric constant as compared to a dense insulating layer, capacitance due to electrodes or wirings can be further reduced.

In addition, a layer including an inorganic material containing a large amount of nitride, such as silicon nitride oxide or silicon nitride, may be included in the insulating layer 532 or the insulating layer 534. Thus, the impurity such as water or hydrogen contained in the material included in the transistor 560 in the lower portion can be prevented from entering the oxide semiconductor layer 544 of the transistor 562 in the upper portion that is formed later. Note that in this case, it is difficult to remove the layer including an inorganic insulating material containing a large amount of nitrogen only by CMP treatment performed in a later step; therefore, CMP treatment and etching treatment are preferably performed in combination.

For example, silicon oxynitride and silicon oxide are used for forming the insulating layer 532 and the insulating layer 534, respectively. In this manner, only an inorganic insulating material containing a large amount of oxygen, such as silicon oxynitride or silicon oxide, is used for the insulating layer 532 and the insulating layer 534, whereby CMP treatment can be easily performed on the insulating layer 532 and the insulating layer 534 in a later step.

Note that a stacked structure of the insulating layer 532 and the insulating layer 534 is employed here; however, one embodiment of the disclosed invention is not limited to this. A single-layer structure or a stacked structure including three or more layers can also be used. For example, the following structure may be employed: silicon oxynitride and silicon oxide are used for the insulating layer 532 and the insulating layer 534, respectively, and a silicon nitride oxide film is formed between the insulating layer 532 and the insulating layer 534.

Through the above steps, the transistor 560 including the SDI substrate is formed (see FIG. 16D). Since the transistor 560 including a semiconductor material other than an oxide semiconductor is capable of high-speed operation, when the transistor is used as a reading transistor, high-speed reading operation is possible. Further, a logic circuit (also referred to as an arithmetic circuit) or the like can be formed using the transistor 560.

Figure 16E:
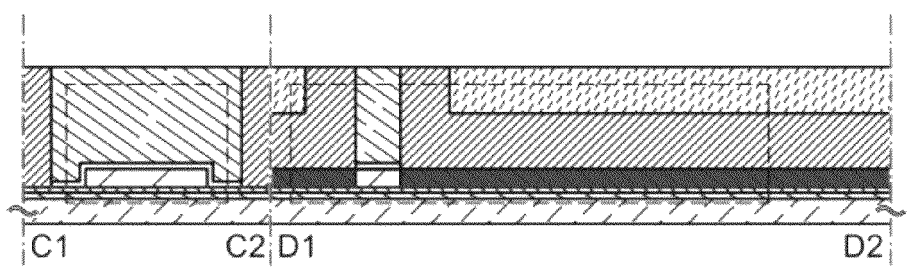

Then, the insulating layer 532 and the insulating layer 534 are subjected to CMP treatment, so that a top surface of the gate electrode 524a is exposed (see FIG. 16E). Instead of CMP treatment, etching treatment or the like can be used as the treatment for exposing the top surface of the gate electrode 524a, and it is preferable that surfaces of the insulating layer 532 and the insulating layer 534 be as planar as possible in order that characteristics of the transistor 562 to be formed later are improved.

After that, as treatment before formation of the transistor 562, CMP treatment is performed on the insulating layer 532 and the insulating layer 534, so that surfaces of the insulating layer 532 and the insulating layer 534 are planarized and a top surface of the gate electrode 524a is exposed (see FIG. 16E).

The CMP treatment may be performed once or plural times. When the CMP treatment is performed plural times, first polishing is preferably performed with a high polishing rate followed by finishing polishing with a low polishing rate. In this manner, by combining polishing with different polishing rates, the planarity of the surfaces of the insulating layer 532 and the insulating layer 534 can be further improved.

As the treatment for planarizing the insulating layer 532 and the insulating layer 534, etching treatment or the like can be performed instead of CMP treatment, and planarization is preferably performed so that each of the surfaces of the insulating layer 532 and the insulating layer 534 has an RMS roughness of less than or equal to 1 nm, or preferably less than or equal to 0.5 nm in order to improve the planarity and the uniformity of the oxide semiconductor layer 544 and improve characteristics of the transistor 562.

In addition, when the stacked layer structure of the insulating layer 532 and the insulating layer 534 includes an inorganic insulating material containing a large amount of nitrogen, such as silicon nitride or silicon nitride oxide, since it is difficult to remove the inorganic insulating material containing a large amount of nitrogen only by the CMP treatment, CMP treatment and etching treatment are preferably performed in combination. As the etching treatment for the inorganic insulating material containing a large amount of nitrogen, either dry etching or wet etching may be used. However, in view of miniaturization of elements, dry etching is preferably used. In addition, it is preferable that etching conditions (an etching gas, an etchant, an etching time, a temperature, or the like) be set appropriately so that etching rates of the respective insulating layers are equal to each other and high etching selectivity with the gate electrode 524a can be obtained. In addition, as an etching gas for dry etching, for example, a gas containing fluorine (trifluoromethane ($CHF_3$)), a gas to which a rare gas such as helium (He) or argon (Ar) is added, or the like can be used.

In addition, when the top surface of the gate electrode 524a is exposed from the insulating layer 534, the top surface of the gate electrode 524a and a surface of the insulating layer 534 are included in the same surface.

Note that before or after the above steps, a step for forming an additional electrode, wiring, semiconductor layer, or insulating layer may be performed. For example, an electrode which is connected to part of the metal compound region 528 and functions as a source or drain electrode of the transistor 560 may be formed. In addition, a multilayer wiring structure in which an insulating layer and a conductive layer are stacked is employed as a wiring structure, so that a highly-integrated semiconductor device can be provided.

After that, the transistor 562 and the capacitor 564 which are electrically connected to the transistor 560 are manufactured (FIG. 14A). Since manufacturing methods of the transistor 562 and the capacitor 564 are the same as those of the transistor 262 and the capacitor 264, the description of the manufacturing methods are omitted here. The above embodiment can be referred to for the details of the manufacturing methods.

Through the above steps, the semiconductor device in which the transistor including a semiconductor material other than an oxide semiconductor is included in the lower portion and the transistor including an oxide semiconductor is included in the upper portion, and which can be used as a memory device can be provided.

With a combination of the transistor including a semiconductor material other than an oxide semiconductor and the transistor including an oxide semiconductor, the semiconductor device capable of holding data for a long time and reading data at high speed, which can be used as a memory device, can be obtained.

In addition, by providing the oxide semiconductor layer over a surface with favorable planarity, the semiconductor device in which the transistor whose transistor characteristics are improved is stacked over the transistor including a semiconductor material other than an oxide semiconductor can be provided.

When the gate electrode 524a and the source or drain electrode 542a are directly connected to each other, higher integration of the semiconductor device can be achieved because a contact area can be reduced. Accordingly, a storage capacity per unit area of the semiconductor device which can be used as a memory device can be increased.

The structures, methods, and the like described in this embodiment can be combined as appropriate with any of the structures, methods, and the like described in the other embodiments.

Embodiment 4

In this embodiment, application examples of a semiconductor device according to an embodiment of the disclosed invention will be described with reference to FIGS. 17A-1, 17A-2, and 17B. Here, an example of a memory device will be described. Note that in a circuit diagram, "OS" is written beside a transistor in order to indicate that the transistor includes an oxide semiconductor.

Figures 1, 17A:
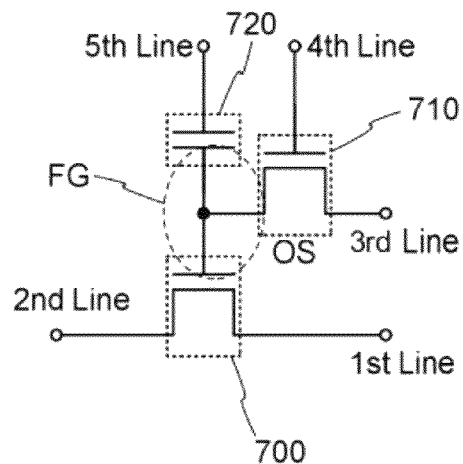

In the semiconductor device illustrated in FIG. 17A-1, a first wiring (a 1st Line) is electrically connected to a source electrode of a transistor 700, and a second wiring (a 2nd Line) is electrically connected to a drain electrode of the transistor 700. A gate electrode of the transistor 700 and one of a source electrode and a drain electrode of a transistor 710 are electrically connected to one of electrodes of a capacitor 720. A third wiring (a 3rd Line) is electrically connected to the other of the source electrode and the drain electrode of the transistor 710, and a fourth wiring (a 4th Line) is electrically connected to a gate electrode of the transistor 710. A fifth wiring (a 5th Line) is electrically connected to the other electrode of the capacitor 720.

Here, a transistor including an oxide semiconductor is used as the transistor 710. Here, as the transistor including an oxide semiconductor, for example, the transistor 262, the transistor 272, the transistor 282, the transistor 292, or the transistor 562 described in the above embodiments can be used. A transistor including an oxide semiconductor has a characteristic of a significantly small off current. Therefore, when the transistor 710 is turned off, the potential of the gate electrode of the transistor 700 can be held for a very long time. By providing the capacitor 720, holding of charge given to the gate electrode of the transistor 700 and reading of held data can be easily performed. Here, as the capacitor 720, for example, the capacitor 264, the capacitor 274, the capacitor 284, the capacitor 294, or the capacitor 564 described in the above embodiments can be used.

In addition, a transistor including a semiconductor material other than an oxide semiconductor is used as the transistor 700. Note that as the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material may be used. A transistor including such a semiconductor material can be operated at high speed easily. Here, as the transistor including a semiconductor material other than an oxide semiconductor, for example, the transistor 260 or the transistor 560 described in the above embodiments can be used.

Figure 17B:
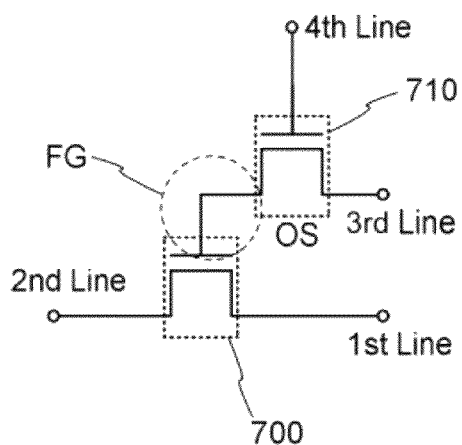

Alternatively, a structure without the capacitor 720 as illustrated in FIG. 17B can be employed.

The semiconductor device illustrated in FIG. 17A-1 utilizes a characteristic in which the potential of the gate electrode of the transistor 700 can be held, thereby writing, holding, and reading data as follows.

Firstly, writing and holding of data will be described. First, the potential of the fourth wiring is set to a potential at which the transistor 710 is turned on, so that the transistor 710 is turned on. Accordingly, the potential of the third wiring is supplied to the gate electrode of the transistor 700 and the capacitor 720. That is, predetermined charge is given to the gate electrode of the transistor 700 (writing). Here, one of charges for supply of two different potentials (hereinafter, a charge for supply of a low potential is referred to as a charge $Q_L$ and a charge for supply of a high potential is referred to as a charge $Q_H$) is given to the gate electrode of the transistor 700. Note that charges giving three or more different potentials may be applied to improve a storage capacity. After that, the potential of the fourth wiring is set to a potential at which the transistor 710 is turned off, so that the transistor 710 is turned off. Thus, the charge given to the gate electrode of the transistor 700 is held (holding).

Since the off current of the transistor 710 is significantly low, the charge of the gate electrode of the transistor 700 is held for a long time.

Secondly, reading of data will be described. By supplying an appropriate potential (reading potential) to the fifth wiring while a predetermined potential (a constant potential) is supplied to the first wiring, the potential of the second wiring varies depending on the amount of charge held in the gate electrode of the transistor 700. This is because in general, when the transistor 700 is an n-channel transistor, an apparent threshold voltage $V_{th\_H}$ in the case where $Q_H$ is given to the gate electrode of the transistor 700 is lower than an apparent threshold voltage $V_{th\_L}$ in the case where $Q_L$ is given to the gate electrode of the transistor 700. Here, an apparent threshold voltage refers to the potential of the fifth wiring, which is needed to turn on the transistor 700. Thus, the potential of the fifth wiring is set to a potential $V_0$ intermediate between $V_{th\_H}$ and $V_{th\_L}$, whereby charge given to the gate electrode of the transistor 700 can be determined. For example, in the case where $Q_H$ is given in writing, when the potential of the fifth wiring is set to $V_0$ ($>V_{th\_H}$), the transistor 700 is turned on. In the case where $Q_L$ is given in writing, even when the potential of the fifth wiring is set to $V_0$ ($>V_{th\_L}$), the transistor 700 remains in an off state. Therefore, the held data can be read by the potential of the second wiring.

Note that in the case where memory cells are arrayed to be used, only data of desired memory cells is needed to be read. Thus, in order that data of a predetermined memory cell is read and data of the other memory cells is not read, in the case where the transistors 700 are connected in parallel between the memory cells, potential at which the transistor 700 is turned off regardless of a state of the gate electrode, that is, potential lower than $V_{th\_H}$ may be supplied to fifth wirings of the memory cells whose data is not to be read. In the case where the transistors 700 are connected in series between the memory cells, potential at which the transistor 700 is turned on regardless of the state of the gate electrode, that is, potential higher than $V_{th\_L}$ may be supplied to the fifth wirings of the memory cells whose data is not to be read.

Thirdly, rewriting of data will be described. Rewriting of data is performed in a manner similar to that of the writing and holding of data. That is, the potential of the fourth wiring is set to a potential at which the transistor 710 is turned on, so that the transistor 710 is turned on. Accordingly, the potential of the third wiring (potential related to new data) is supplied to the gate electrode of the transistor 700 and the capacitor 720. After that, the potential of the fourth wiring is set to a potential which the transistor 710 is turned off, so that the transistor 710 is turned off. Accordingly, charge related to new data is given to the gate electrode of the transistor 700.

In the semiconductor device according to the disclosed invention, data can be directly rewritten by another writing of data as described above. Therefore, extracting of charge from a floating gate with the use of high voltage needed in a flash memory or the like is not necessary and thus, reduction in operation speed, which is attributed to erasing operation, can be suppressed. In other words, high-speed operation of the semiconductor device can be realized.

Note that the source electrode or the drain electrode of the transistor 710 is electrically connected to the gate electrode of the transistor 700, thereby having an effect similar to that of a floating gate of a floating gate transistor used for a nonvolatile memory element. Therefore, a portion in the drawing where the source electrode or the drain electrode of the transistor 710 is electrically connected to the gate electrode of the transistor 700 is called a floating gate portion FG in some cases. When the transistor 710 is off, the floating gate portion FG can be regarded as being embedded in an insulator and thus charge is held in the floating gate portion FG. The amount of off current of the transistor 710 including an oxide semiconductor is smaller than or equal to one hundred thousandth of the amount of off current of a transistor including a silicon semiconductor or the like; thus, lost of the charge accumulated in the floating gate portion FG due to leakage current of the transistor 710 is negligible. That is, with the transistor 710 including an oxide semiconductor, a nonvolatile memory device which can hold data without being supplied with power can be realized.

For example, when the off current of the transistor 710 is less than or equal to 10 zA/μm (1 zA (zeptoampere) is 1× $10^{-21}$ A) at room temperature and the capacitance value of the capacitor 720 is approximately 10 ff, data can be held for $10^4$ seconds or longer. It is needless to say that the holding time depends on transistor characteristics and the capacitance value.

Further, in that case, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limit on the number of times of writing in principle. Furthermore, high voltage needed for writing or erasing in a conventional floating gate transistor is not necessary.

Figures 2, 17A:
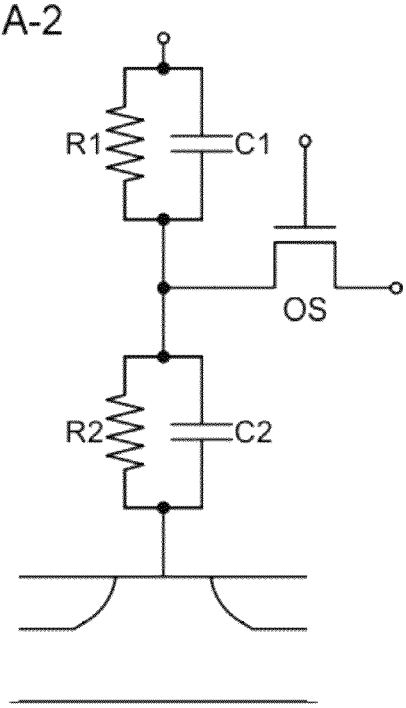

The components such as transistors in the semiconductor device in FIG. 17A-1 can be regarded as including a resistor and a capacitor as shown in FIG. 17A-2. That is, in FIG. 17A-2, the transistor 700 and the capacitor 720 are each regarded as including a resistor and a capacitor. R1 and C1 denote the resistance value and the capacitance value of the capacitor 720, respectively. The resistance R1 corresponds to the resistance of the insulating layer included in the capacitor 720. R2 and C2 denote the resistance value and the capacitance value of the transistor 700, respectively. The resistance value R2 corresponds to the resistance value which depends on a gate insulating layer at the time when the transistor 700 is on. The capacitance value C2 corresponds to the capacitance value of so-called gate capacitance (capacitance formed between the gate electrode and each of the source electrode and the drain electrode and capacitance formed between the gate electrode and the channel formation region).

An electron holding period (also referred to as a data holding period) is determined mainly by the off current of the transistor 710 under the conditions that gate leakage of the transistor 710 is sufficiently small and that R1≥ROS and R2≥ROS are satisfied, where the resistance value (also referred to as effective resistance) between the source electrode and the drain electrode in the case where the transistor 710 is off is ROS.

On the other hand, when the conditions are not satisfied, it is difficult to sufficiently secure the holding period even if the off current of the transistor 710 is small enough. This is because a leakage current other than the off current of the transistor 710 (e.g., a leakage current generated between the source electrode and the gate electrode) is large. Thus, it can be said that the semiconductor device disclosed in this embodiment desirably satisfies the above relation.

It is preferable that C1≥C2 be satisfied. This is because when C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be reduced.

When the above relation is satisfied, a more preferable semiconductor device can be realized. Note that R1 and R2 are controlled by the gate insulating layer of the transistor 700 and the insulating layer of the capacitor 720. The same relation is applied to C1 and C2. Therefore, the material, the thickness, and the like of the gate insulating layer are desirably set as appropriate to satisfy the above relation.

In the semiconductor device described in this embodiment, the floating gate portion FG has an effect similar to a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of factors inhibiting high integration of the semiconductor device. The factor is attributed to a basic principle of a flash memory, in which a tunneling current flows in applying a high electrical field.

Further, because of the above principle of a flash memory, deterioration of an insulating film proceeds and thus another problem of the limit on the number of times of rewriting (approximately $10^4$ to $10^5$ times) occurs.

The semiconductor device according to the disclosed invention is operated by switching of a transistor including an oxide semiconductor and does not use the above-described principle of charge injection by a tunneling current. That is, high electrical field for charge injection is not necessary unlike a flash memory. Accordingly, it is not necessary to consider an influence of a high electrical field from a control gate on an adjacent cell, which facilitates high integration.

Further, charge injection by a tunneling current is not utilized, which means that there is no cause for deterioration of a memory cell. In other words, the semiconductor device according to the disclosed invention has higher durability and reliability than a flash memory.

In addition, it is also advantageous that a high electrical field is unnecessary and a large supplemental circuit (such as a booster circuit) is unnecessary as compared to a flash memory.

In the case where the dielectric constant $\in r1$ of the insulating layer included in the capacitor 720 is different from the dielectric constant $\in r2$ of the insulating layer included in the transistor 700, it is easy to satisfy $C1 \geq C2$ while $2 \cdot S2 \geq S1$ (desirably, $S2 \geq S1$) is satisfied where S1 is the area of the insulating layer included in the capacitor 720 and S2 is the area of the insulating layer forming the gate capacitance of the transistor 700. That is, it is easy to satisfy $C1 \geq C2$ while it is satisfied that the area of the insulating layer included in the capacitor 720 is small. Specifically, for example, a film formed of a high-k material such as hafnium oxide or a stack of a film formed of a high-k material such as hafnium oxide and a film formed of an oxide semiconductor is used for the insulating layer included in the capacitor 720 so that $\in r1$ can be set to 10 or more, preferably 15 or more, and silicon oxide is used for the insulating layer forming the gate capacitance so that $\in r2$ can be set to 3 to 4.

Combination of such structures enables higher integration of the semiconductor device according to the disclosed invention.

Note that an n-channel transistor in which electrons are majority carriers is used in the above description; it is needless to say that a p-channel transistor in which holes are majority carriers can be used instead of the n-channel transistor.

As described above, a semiconductor device according to an embodiment of the disclosed invention has a nonvolatile memory cell including a writing transistor where a leakage current (off current) between a source and a drain in an off state is small, a reading transistor including a semiconductor material different from that of the writing transistor, and a capacitor.

The off current of the writing transistor is preferably less than or equal to 100 zA ($1 \times 10^{-19}$ A), more preferably less than or equal to 10 zA ($1 \times 10^{-20}$ A), still more preferably less than or equal to 1 zA ($1 \times 10^{-21}$ A) at ambient temperature (e.g., 25° C.). In the case of general silicon, it is difficult to achieve such small off current. However, in a transistor obtained by processing an oxide semiconductor under an appropriate condition, a small off current can be achieved. Therefore, a transistor including an oxide semiconductor is preferably used as the writing transistor.

In addition, a transistor including an oxide semiconductor has a small subthreshold swing (S-value), so that the switching rate can be sufficiently high even if mobility is comparatively low. Therefore, by using the transistor as the writing transistor, rising of a writing pulse given to the floating gate portion FG can be very sharp. Further, an off current is small and thus, the amount of charge held in the floating gate portion FG can be reduced. That is, by using a transistor including an oxide semiconductor, rewriting of data can be performed at high speed.

As for the reading transistor, although there is no limitation on off current, it is desirable to use a transistor which is operated at high speed in order to increase the reading rate. For example, a transistor with a switching rate of 1 nanosecond or lower is preferably used as the reading transistor.

In this manner, when a transistor including an oxide semiconductor is used as a writing transistor, and a transistor including a semiconductor material other than an oxide semiconductor is used as a reading transistor, a semiconductor device capable of holding data for a long time and reading data at high speed, which can be used as a memory device, can be obtained.

The structures, methods, and the like described in this embodiment can be combined as appropriate with any of the structures, methods, and the like described in the other embodiments.

Embodiment 5

In this embodiment, application examples of a semiconductor device according to an embodiment of the disclosed invention will be described with reference to FIGS. 18A and 18B and FIGS. 19A to 19C.

Figure 18A:
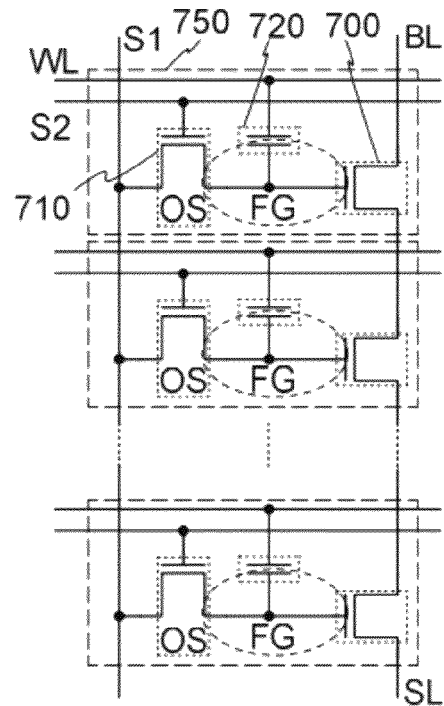
FIGS. 18A and 18B are circuit diagrams of semiconductor devices.
Figure 18B:
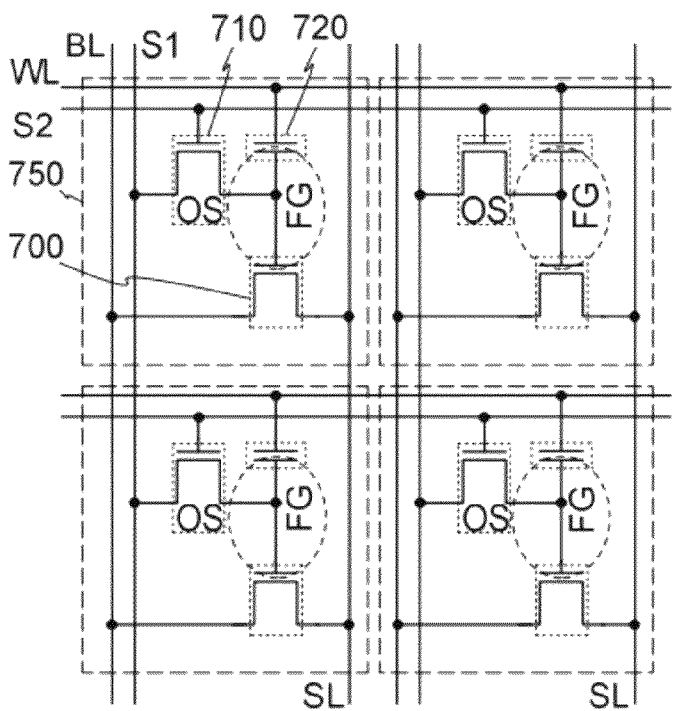

FIGS. 18A and 18B are examples of circuit diagrams of semiconductor devices each including a plurality of semiconductor devices (hereinafter also referred to as memory cells 750) illustrated in FIG. 17A-1. FIG. 18A is a circuit diagram of a so-called NAND semiconductor device in which the memory cells 750 are connected in series, and FIG. 18B is a circuit diagram of a so-called NOR semiconductor device in which the memory cells 750 are connected in parallel.

The semiconductor device in FIG. 18A includes a source line SL, a bit line BL, a first signal line S1, a plurality of second signal lines S2, a plurality of word lines WL, and the plurality of memory cells 750. In FIG. 18A, one source line SL and one bit line BL are provided, but this embodiment is not limited to this. A plurality of source lines SL and a plurality of bit lines BL may be provided.

In each of the memory cells 750, a gate electrode of a transistor 700, one of a source electrode and a drain electrode of a transistor 710, and one of electrodes of a capacitor 720 are electrically connected to one another. The first signal line S1 and the other of the source electrode and the drain electrode of the transistor 710 are electrically connected to each other, and the second signal line S2 and the gate electrode of the transistor 710 are electrically connected to each other. The word line WL and the other of the electrodes of the capacitor 720 are electrically connected to each other.

Further, the source electrode of the transistor 700 included in the memory cell 750 is electrically connected to the drain electrode of the transistor 700 in the adjacent memory cell 750. The drain electrode of the transistor 700 included in the memory cell 750 is electrically connected to the source electrode of the transistor 700 in the adjacent memory cell 750. Note that the drain electrode of transistor 700 included in the memory cell 750 of the plurality of memory cells connected in series, which is provided at one end, and the bit line are electrically connected to each other. The source electrode of the transistor 700 included in the memory cell 750 of the plurality of memory cells connected in series, which is provided at the other end, and the source line are electrically connected to each other.

In the semiconductor device in FIG. 18A, writing operation and reading operation are performed in each row. The writing operation is performed as follows. A potential at which the transistor 710 is turned on is applied to the second signal line S2 of a row where writing is to be performed, whereby the transistor 710 of the row where writing is to be performed is turned on. Accordingly, the potential of the first signal line S1 is supplied to the gate electrode of the transistor 700 of the specified row, so that a predetermined charge is given to the gate electrode. Thus, data can be written to the memory cell of the specified row.

Further, the reading operation is performed as follows. First, a potential at which the transistor 700 is turned on regardless of charge given to the gate electrode thereof is supplied to the word lines WL of the rows other than the row where reading is to be performed, so that the transistors 700 of the rows other than the row where reading is to be performed are turned on. Then, a potential (reading potential) at which an on state or an off state of the transistor 700 is determined depending on charge in the gate electrode of transistor 700 is supplied to the word line WL of the row where reading is to be performed. After that, a constant potential is supplied to the source line SL so that a reading circuit (not shown) connected to the bit line BL is operated. Here, the plurality of transistors 700 between the source line SL and the bit line BL are on except the transistors 700 of the row where reading is to be performed; therefore, conductance between the source line SL and the bit line BL is determined by a state (an on state or an off state) of the transistor 700 of the row where reading is to be performed. The conductance of the transistors 700 in the rows where which reading is performed depends on charge in the gate electrodes thereof. Thus, a potential of the bit line BL varies accordingly. By reading the potential of the bit line with the reading circuit, data can be read from the memory cells of the specified row.

The semiconductor device in FIG. 18B includes a plurality of source lines SL, a plurality of bit lines BL, a plurality of first signal lines S1, a plurality of second signal lines S2, a plurality of word lines WL, and a plurality of memory cells 750. The gate electrode of the transistor 700, one of the source electrode and the drain electrode of the transistor 710, and one of electrodes of the capacitor 720 are electrically connected to one another. The source line SL and the source electrode of the transistor 700 are electrically connected to each other. The bit line BL and the drain electrode of the transistor 700 are electrically connected to each other. The first signal line S1 and the other of the source electrode and the drain electrode of the transistor 710 are electrically connected to each other, and the second signal line S2 and the gate electrode of the transistor 710 are electrically connected to each other. The word line WL and the other electrode of the capacitor 720 are electrically connected to each other.

In the semiconductor device in FIG. 18B, writing operation and reading operation are performed in each row. The writing operation is performed in a manner similar to that of the semiconductor device in FIG. 18A. The reading operation is performed as follows. First, a potential at which the transistor 700 is turned off regardless of charge given to the gate electrode of the transistor 700 is supplied to the word lines WL of the rows other than the row where reading is to be performed, so that the transistor 700 of the rows other than the row where reading is to be performed are turned off. Then, a potential (reading potential) at which an on state or an off state of the transistor 700 is determined depending on charge in the gate electrode of the transistor 700 is supplied to the word line WL of the row where reading is to be performed. After that, a constant potential is supplied to the source line SL so that a reading circuit (not shown) connected to the bit line BL is operated. Here, conductance between the source lines SL and the bit lines BL is determined by a state (an on state or an off state) of the transistor 700 of the row where reading is performed. That is, a potential of the bit lines BL depends on charge in the gate electrodes of the transistors 700 of the row where reading is performed. By reading the potential of the bit line with the reading circuit, data can be read from the memory cells of the specified row.

Although the amount of data which can be held in each of the memory cells 750 is one bit in the above description, the structure of the memory device of this embodiment is not limited to this. The amount of data which is held in each of the memory cells 750 may be increased by preparing three or more potentials to be supplied to the gate electrode of the transistor 700. For example, in the case where the number of potentials to be supplied to the gate electrode of the transistor 700 is four, data of two bits can be stored in each of the memory cells.

Next, examples of reading circuits which can be used for the semiconductor devices in FIGS. 18A and 18B, or the like will be described with reference to FIGS. 19A to 19C.

Figure 19A:
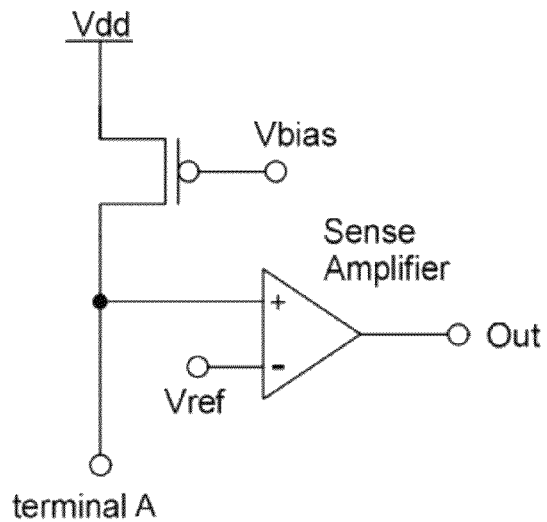
FIGS. 19A to 19C are circuit diagrams of semiconductor devices.

FIG. 19A illustrates a schematic of the reading circuit. The reading circuit includes a transistor and a sense amplifier circuit.

At the time of reading of data, a terminal A is connected to a bit line to which a memory cell from which data is read is connected. Further, a bias potential $V_{bias}$ is applied to a gate electrode of the transistor so that a potential of the terminal A is controlled.

The resistance of the memory cell 750 varies depending on stored data. Specifically, when the transistor 700 in a selected memory cell 750 is on, the memory cell has a low resistance; whereas when the transistor 700 in a selected memory cell 750 is off, the memory cell has a high resistance.

When the memory cell has a high resistance, a potential of the terminal A is higher than a reference potential $V_{ref}$ and the sense amplifier circuit outputs a potential corresponding to the potential of the terminal A. On the other hand, when the memory cell has a low resistance, the potential of the terminal A is lower than the reference potential $V_{ref}$ and the sense amplifier circuit outputs a potential corresponding to the potential of the terminal A.

Thus, by using the reading circuit, data can be read from the memory cell. Note that the reading circuit of this embodiment is one of examples. Another circuit may be used. The reading circuit may further include a precharge circuit. Instead of the reference potential $V_{ref}$, a reference bit line may be connected to the sense amplifier circuit.

Figure 19B:
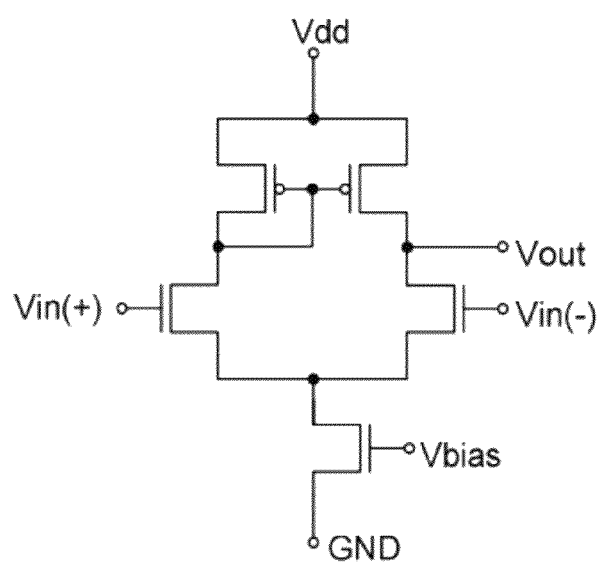

FIG. 19B illustrates a differential sense amplifier which is an example of sense amplifier circuits. The differential sense amplifier has an input terminal $V_{in}(+)$ and an input terminal $V_{in}(-)$, and an output terminal $V_{out}$, and amplifies the difference between $V_{in}(+)$ and $V_{in}(-)$. $V_{out}$ is approximately high output when $V_{in}(+)>V_{in}(-)$, and is approximately low output when $V_{in}(+)<V_{in}(-)$. In the case where the differential sense amplifier is used for the reading circuit, one of $V_{in}(+)$ and $V_{in}(-)$ is connected to the input terminal A, and the reference potential $V_{ref}$ is supplied to the other of $V_{in}(+)$ and $V_{in}(-)$.

Figure 19C:
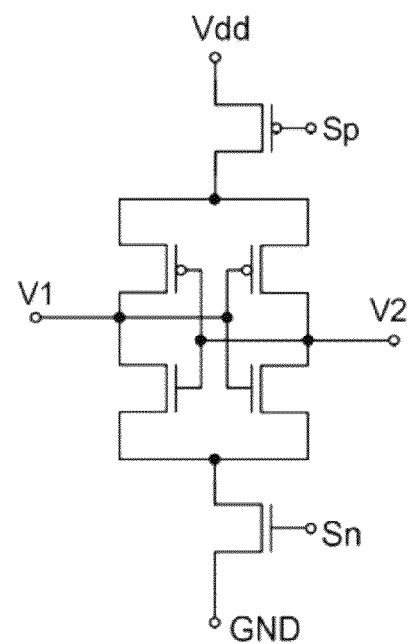

FIG. 19C illustrates a latch sense amplifier which is an example of sense amplifier circuits. The latch sense amplifier has input-output terminals V1 and V2 and input terminals of control signals Sp and Sn. First, the control signals Sp and Sn are set to a signal High and a signal Low, respectively, and a power supply potential ($V_{dd}$) is interrupted. Then, potentials to be compared are applied to $V_1$ and $V_2$. After that, the control signals Sp and Sn are set to a signal Low and a signal High, respectively, and a power supply potential ($V_{dd}$) is supplied. If $V_{1in}>V_{2in}$ is satisfied for the potentials for comparison $V_{1in}$ and $V_{2in}$, an output from $V_1$ is a signal High and an output from $V_2$ is a signal Low, whereas an output from $V_1$ is a signal Low and an output from $V_2$ is a signal High if $V_{1in}<V_{2in}$ is satisfied. By utilizing such a relation, the difference between $V_{1in}$ and $V_{2in}$ can be amplified. In the case where the latch sense amplifier is used for the reading circuit, one of $V_1$ and $V_2$ is connected to the terminal A and the output terminal through a switch, and the reference potential $V_{ref}$ is supplied to the other of $V_1$ and $V_2$.

The structures, methods, and the like described in this embodiment can be combined as appropriate with any of the structures, methods, and the like described in the other embodiments.

Embodiment 6

In this embodiment, application of the semiconductor device described in any of the above embodiments to an electronic device is described with reference to FIGS. 20A to 20F. In this embodiment, the case where the above semiconductor device is applied to an electronic device such as a computer, a mobile phone (also referred to as a mobile telephone or a mobile telephone device), a portable information terminal (including a portable game machine, an audio reproducing device, and the like), a digital camera, a digital video camera, an electronic paper, or a television device (also referred to as a television or a television receiver) will be described.

Figure 20A:
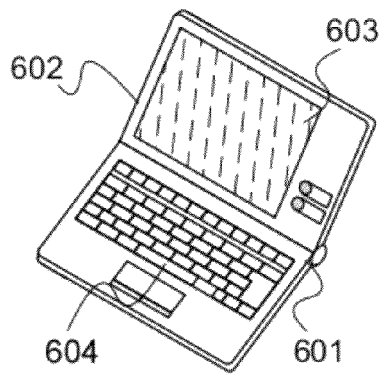
FIGS. 20A to 20F are diagrams for illustrating electronic appliances using semiconductor devices.

FIG. 20A illustrates a laptop personal computer which includes a housing 601, a housing 602, a display portion 603, a keyboard 604, and the like. In the housing 601 and the housing 602, the semiconductor device of any of the above embodiments which is provided with a combination of a transistor including an oxide semiconductor and a transistor including a semiconductor material other than an oxide semiconductor is provided. Therefore, the laptop personal computer capable of holding data for a long time and reading data at high speed can be obtained.

Figure 20B:
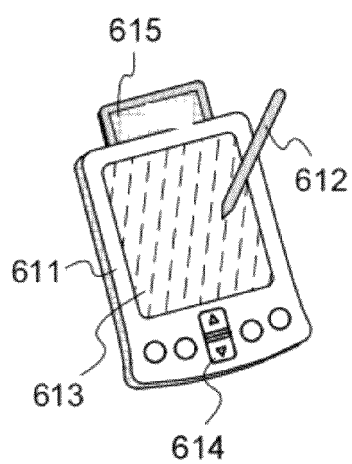

FIG. 20B illustrates a portable information terminal (personal digital assistance (PDA)) which includes a main body 611 provided with a display portion 613, an external interface 615, operation buttons 614, and the like. In addition, a stylus 612 which controls the portable information terminal and the like are provided. In the main body 611, the semiconductor device of any of the above embodiments which is provided with a combination of the transistor including an oxide semiconductor and a transistor including a semiconductor material other than an oxide semiconductor is provided. Therefore, the portable information terminal capable of holding data for a long time and reading data at high speed can be obtained.

Figure 20C:
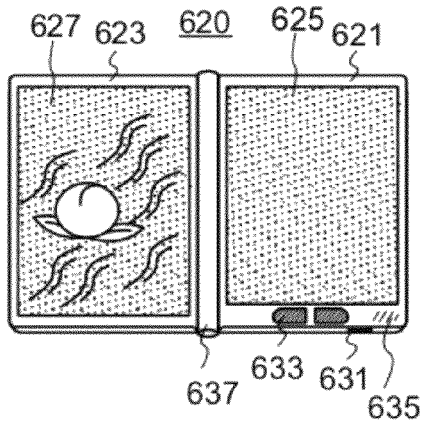

FIG. 20C illustrates an electronic book reader 620 which is mounted with electronic paper and includes two housings, a housing 621 and a housing 623. The housing 621 and the housing 623 are respectively provided with a display portion 625 and a display portion 627. The housing 621 is combined with the housing 623 by a hinge 637, so that the electronic book reader 620 can be opened and closed using the hinge 637 as an axis. The housing 621 is provided with a power button 631, operation keys 633, a speaker 635, and the like. In at least one of the housing 621 and the housing 623, the semiconductor device of any of the above embodiments which is provided with a combination of a transistor including an oxide semiconductor and a transistor including a semiconductor material other than an oxide semiconductor is provided. Therefore, the electronic book reader capable of holding data for a long time and reading data at high speed can be obtained.

Figure 20D:
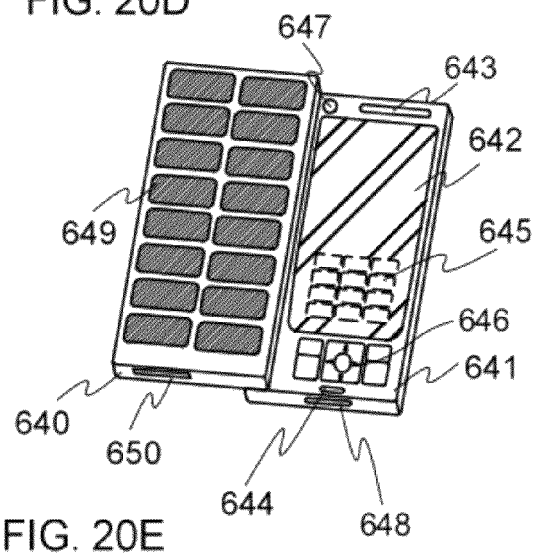

FIG. 20D illustrates a mobile phone which includes two housings, a housing 640 and a housing 641. Moreover, the housing 640 and the housing 641 in a state where they are developed as illustrated in FIG. 20D can be slid so that one is lapped over the other. Therefore, the size of the mobile phone can be reduced, which makes the mobile phone suitable for being carried around. The housing 641 includes a display panel 642, a speaker 643, a microphone 644, a pointing device 646, a camera lens 647, an external connection terminal 648, and the like. The housing 640 includes a solar cell 649 for charging the mobile phone, an external memory slot 650, and the like. The display panel 642 is provided with a touch-panel function. A plurality of operation keys 645 which are displayed as images is illustrated by dashed lines in FIG. 20D. In addition, an antenna is incorporated in the housing 641. In at least one of the housing 640 and the housing 641, the semiconductor device of any of the above embodiments which is provided with a combination of a transistor including an oxide semiconductor and a transistor including a semiconductor material other than an oxide semiconductor is provided. Therefore, the mobile phone capable of holding data for a long time and reading data at high speed can be obtained.

Figure 20E:
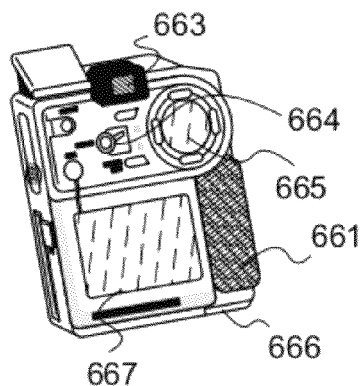

FIG. 20E illustrates a digital camera which includes a main body 661, a display portion 667, an eyepiece portion 663, an operation switch 664, a display portion 665, a battery 666, and the like. In the main body 661, the semiconductor device of any of the above embodiments which is provided with a combination of a transistor including an oxide semiconductor and a transistor including a semiconductor material other than an oxide semiconductor is included. Therefore, the digital camera capable of holding data for a long time and reading data at high speed can be obtained.

Figure 20F:
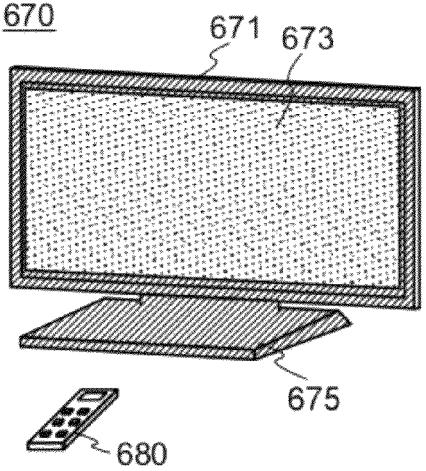

FIG. 20F illustrates a television device 670 which includes a housing 671, a display portion 673, a stand 675, and the like. The television device 670 can be operated with an operation switch of the housing 671 or a remote controller 680. In the housing 671 and the remote controller 680, the semiconductor device of any of the above embodiments which is provided with a combination of a transistor including an oxide semiconductor and a transistor including a semiconductor material other than an oxide semiconductor is provided. Therefore, the television device capable of holding data for a long time and reading data at high speed can be obtained.

As described above, the electronic devices described in this embodiment are each mounted with the semiconductor device according to any of the above embodiments. Therefore, an electronic device having characteristics of being small, high-speed operation, and low power consumption can be realized.

Example 1

In this example, the following steps were performed: a transistor was manufactured using an SOI substrate, an interlayer insulating layer was formed over the transistor, CMP treatment was performed on the interlayer insulating layer, and the planarity of the interlayer insulating layer before and after the CMP treatment was evaluated.

Steps for manufacturing the transistor and the interlayer insulating layer formed over the transistor, which are employed in this example, will be described.

First, an SOI substrate including a glass substrate, a thermal oxide film (the thickness: 100 nm) provided over the glass substrate, and a single crystal silicon layer (the thickness: 60 nm) provided over the thermal oxide film was prepared. Then, the single crystal silicon layer formed over the glass substrate with the thermal oxide film provided therebetween was patterned using dry etching.

Next, a silicon oxynitride film (the thickness: 20 nm) was deposited using a CVD method so as to cover the single crystal silicon layer and the glass substrate, so that a gate insulating layer was formed.

Then, a tantalum nitride film (the thickness: 30 nm) was deposited over the gate insulating layer using a sputtering method, and then a tungsten film (the thickness: 370 nm) was deposited using a sputtering method. After that, a stacked layer of the tantalum nitride film and the tungsten film was patterned using dry etching, so that a gate electrode was formed.

As described above, a top-gate transistor in which the single crystal silicon layer was provided over the glass substrate with the thermal oxide film provided therebetween, the gate insulating layer was provided over the single crystal silicon layer, and the gate electrode was provided over the gate insulating layer could be manufactured.

Next, a silicon oxynitride film (the thickness: 50 nm) was deposited using a plasma CVD method so as to cover the transistor. The silicon oxynitride film functions as a protective insulating layer for the transistor. After that, heat treatment was performed at 550° C. for one hour. Further, heat treatment was performed at 450° C. for one hour in a hydrogen atmosphere.

Further, a silicon oxide film (the thickness: 500 nm) was deposited using a sputtering method so as to cover the protective insulating layer. The silicon oxide film functions as an interlayer insulating layer.

Finally, the interlayer insulating layer formed using a silicon oxide film was subjected to CMP treatment so that the polished interlayer insulating layer over the gate electrode has a thickness of 340 nm. At this time, a polyurethane polishing cloth was used, and silica slurry (the grain size: 150 nm) was used as a chemical solution for supplying slurry. The other CMP conditions are as follows: the slurry flow rate was 150 ml/min, the polishing pressure was 0.03 MPa, the spindle rotation speed was 20 rpm, the table rotation speed was 20 rpm, and processing time was 3 min.

Next, an evaluation method of the planarity of the interlayer insulating layer performed before and after the CMP treatment will be described.

In this example, the planarity of the interlayer insulating layer was evaluated by measuring the RMS roughness of a surface of the interlayer insulating layer with an atomic force microscope (AFM). As the AFM, SPA-500 manufactured by SII NanoTechnology Inc. was used. Conditions of the measurement were as follows: the scan rate was 1.0 Hz, the measurement area was 1 μm×1 μm, and the measurement points were 4.

Figure 21:
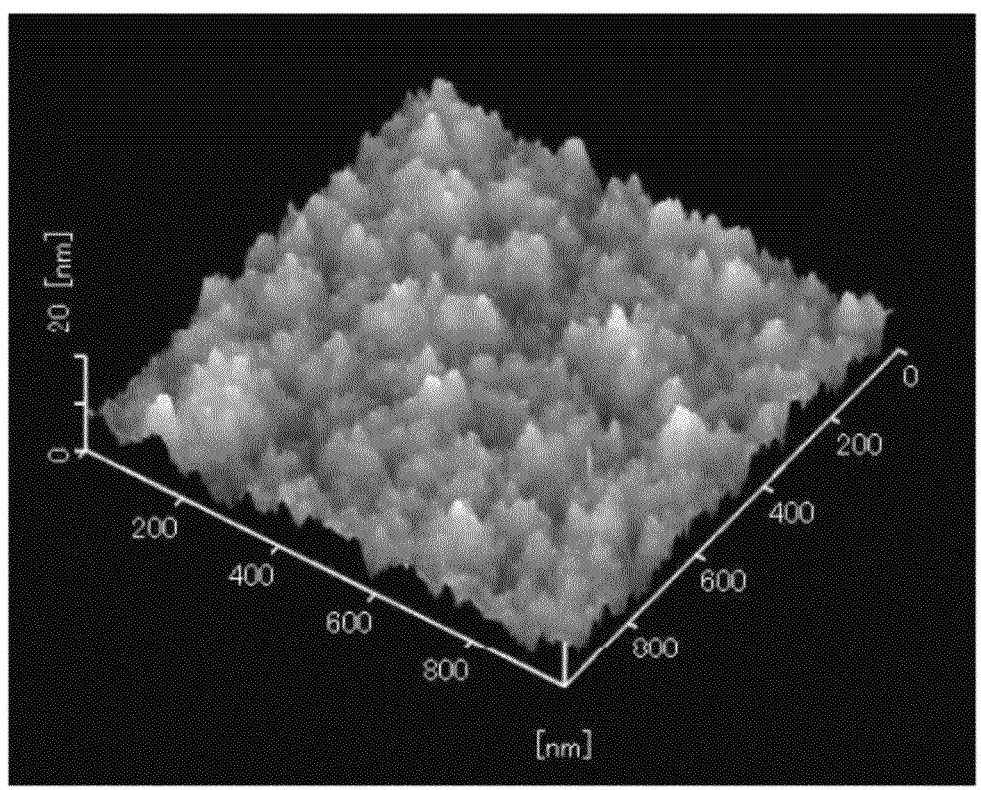
FIG. 21 shows an AFM image of Example 1.
Figure 22:
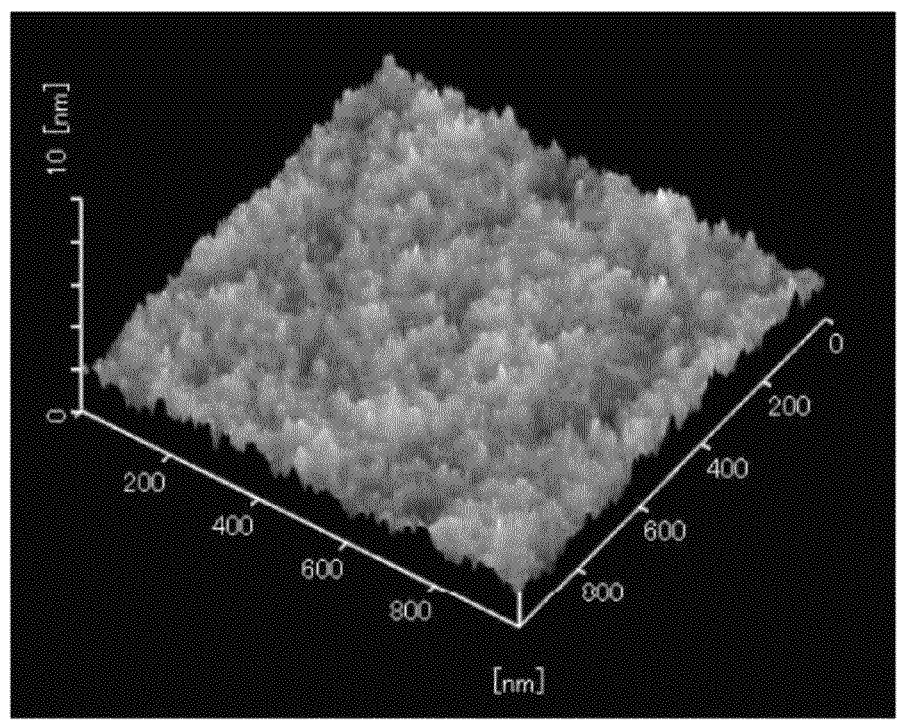
FIG. 22 shows an AFM image of Example 1.

An AFM image of the interlayer insulating layer before the CMP treatment is shown in FIG. 21, and an AFM image of the interlayer insulating layer after the CMP treatment is shown in FIG. 22. As is found in the comparison between FIG. 21 and FIG. 22, the planarity of the surface of the interlayer insulating layer is largely improved by the CMP treatment, and the RMS roughness thereof is reduced from 2.33 nm to 0.37 nm.

By providing an oxide semiconductor layer over the interlayer insulating layer having such a favorable planarity, the planarity and uniformity of the oxide semiconductor layer can be favorable. Here, as for the planarity and uniformity of the oxide semiconductor layer, at least a portion including a channel formation region of the oxide semiconductor layer may have favorable planarity and uniformity. In addition, by using the oxide semiconductor layer with favorable planarity and uniformity, characteristics of a transistor can be improved.

This application is based on Japanese Patent Application serial No. 2010-029278 filed with Japan Patent Office on Feb. 12, 2010, the entire contents of which are hereby incorporated by reference.

The invention claimed is:

1. A semiconductor device comprising
a first transistor;
an insulating layer over the first transistor; and
a second transistor over the insulating layer,
wherein the first transistor comprises:
  a first channel formation region;
  a first gate insulating layer provided over the first channel formation region;
  a first gate electrode overlapping with the first channel formation region, over the first gate insulating layer; and
  a first source electrode electrically connected to the first channel formation region and a first drain electrode electrically connected to the first channel formation region,
wherein the second transistor comprises:
  a second channel formation region including an oxide semiconductor;
  a second source electrode electrically connected to the second channel formation region and a second drain electrode electrically connected to the second channel formation region;
  a second gate electrode overlapping with the second channel formation region; and
  a second gate insulating layer provided between the second channel formation region and the second gate electrode,
wherein the first channel formation region includes a semiconductor material different from a semiconductor material of the second channel formation region,
wherein the insulating layer includes a surface whose root-mean-square surface roughness is less than or equal to 1 nm, and wherein a top surface of the first gate electrode is aligned with the surface of the insulating layer.

2. The semiconductor device according to claim 1, wherein the top surface of the first gate electrode is exposed to be included in a same surface as the insulating layer, and
wherein the first gate electrode and the second source electrode or the second drain electrode are in contact with each other on the top surface of the first gate electrode.

3. The semiconductor device according to claim 1, wherein the surface of the insulating layer is formed through a CMP treatment.

4. The semiconductor device according to claim 1, further comprising impurity regions with the first channel formation region provided therebetween.

5. The semiconductor device according to claim 1, wherein the semiconductor device is incorporated in one selected from the group consisting of a computer, a personal digital assistance, an electronic book, a mobile phone, a camera and a television device.

6. A method for manufacturing a semiconductor device, comprising the steps of:
forming a first transistor including a first channel formation region, a first gate insulating layer provided over the first channel formation region, a first gate electrode overlapping with the first channel formation region over the first gate insulating layer, a first source electrode layer electrically connected to the first channel formation region, and a first drain electrode electrically connected to the first channel formation region;
forming an insulating layer over the first transistor;
planarizing the insulating layer so that a surface of the insulating layer has a root-mean-square surface roughness of less than or equal to 1 nm; and
forming a second transistor including a second channel formation region including an oxide semiconductor, a second source electrode electrically connected to the second channel formation region, a second drain electrode electrically connected to the second channel formation region, a second gate electrode overlapping with the second channel formation region, and a gate insulating layer provided between the second channel formation region and the second gate electrode,
wherein the second channel formation region including the oxide semiconductor is in contact with the insulating layer, and
wherein the first channel formation region includes a semiconductor material different from a semiconductor material of the second channel formation region.

7. The method for manufacturing a semiconductor device according to claim 6, wherein a top surface of the first gate electrode is aligned with the surface of the insulating layer.

8. The method for manufacturing a semiconductor device according to claim 6, wherein the second channel formation region is formed over the surface of the insulating layer.

9. The method for manufacturing a semiconductor device according to claim 6, wherein the semiconductor device is incorporated in one selected from the group consisting of a computer, a personal digital assistance, an electronic book, a mobile phone, a camera and a television device.

10. A method for manufacturing a semiconductor device, comprising the steps of:
forming a first transistor including a first channel formation region, a first gate insulating layer provided over the first channel formation region, a first gate electrode which overlaps with the first channel formation region and is provided over the first gate insulating layer, a first source electrode electrically connected to the first channel formation region, and a first drain electrode electrically connected to the first channel formation region;
forming an insulating layer over the first transistor;
planarizing the insulating layer so that a surface of the insulating layer has a root-mean-square roughness of less than or equal to 1 nm and a top surface of the first gate electrode is exposed to be included in a same surface as the insulating layer; and
forming a second transistor including a second channel formation region including an oxide semiconductor over the insulating layer, a second source electrode electrically connected to the second channel formation region, a second drain electrode electrically connected to the second channel formation region, a second gate electrode provided to overlap with the second channel formation region, a second gate insulating layer provided between the second channel formation region and the second gate electrode,
wherein the second source electrode or the second drain electrode are provided to be in contact with the top surface of the first gate electrode, and
wherein the first channel formation region includes a semiconductor material different from a semiconductor material of the second channel formation region.

11. The method for manufacturing a semiconductor device according to claim 10, wherein the top surface of the first gate electrode is aligned with the surface of the insulating layer.

12. The method for manufacturing a semiconductor device according to claim 10, wherein the second channel formation region is formed over the surface of the insulating layer.

13. The method for manufacturing a semiconductor device according to claim 10, wherein the semiconductor device is incorporated in one selected from the group consisting of a computer, a personal digital assistance, an electronic book, a mobile phone, a camera and a television device.

14. A method for manufacturing a semiconductor device, comprising the steps of:
forming a first transistor including a first channel formation region, a first gate insulating layer provided over the first channel formation region, a first gate electrode overlapping with the first channel formation region over the first gate insulating layer, a first source electrode layer electrically connected to the first channel formation region, and a first drain electrode electrically connected to the first channel formation region;
forming an insulating layer over the first transistor;
planarizing the insulating layer by a CMP treatment; and
forming a second transistor including a second channel formation region including an oxide semiconductor, a second source electrode electrically connected to the second channel formation region, a second drain electrode electrically connected to the second channel formation region, a second gate electrode overlapping with the second channel formation region, and a gate insulating layer provided between the second channel formation region and the second gate electrode,
wherein the second channel formation region including the oxide semiconductor is in contact with the insulating layer,
wherein the first channel formation region includes a semiconductor material different from a semiconductor material of the second channel formation region.

15. The method for manufacturing a semiconductor device according to claim 14, wherein a top surface of the first gate electrode is aligned with a surface of the insulating layer.

16. The method for manufacturing a semiconductor device according to claim 14, wherein the second channel formation region is formed over a surface of the insulating layer.

17. The method for manufacturing a semiconductor device according to claim 14, wherein the semiconductor device is incorporated in one selected from the group consisting of a computer, a personal digital assistance, an electronic book, a mobile phone, a camera and a television device.

18. A method for manufacturing a semiconductor device, comprising the steps of:
forming a first transistor including a first channel formation region, a first gate insulating layer provided over the first channel formation region, a first gate electrode which overlaps with the first channel formation region and is provided over the first gate insulating layer, a first source electrode electrically connected to the first channel formation region, and a first drain electrode electrically connected to the first channel formation region;
forming an insulating layer over the first transistor;
planarizing the insulating layer by a CMP treatment so that a top surface of the first gate electrode is exposed to be included in a same surface as the insulating layer; and
forming a second transistor including a second channel formation region including an oxide semiconductor over the insulating layer, a second source electrode electrically connected to the second channel formation region, a second drain electrode electrically connected to the second channel formation region, a second gate electrode provided to overlap with the second channel formation region, a second gate insulating layer provided between the second channel formation region and the second gate electrode,
wherein the second source electrode or the second drain electrode are provided to be in contact with the top surface of the first gate electrode, and
wherein the first channel formation region includes a semiconductor material different from a semiconductor material of the second channel formation region.

19. The method for manufacturing a semiconductor device according to claim 18, wherein the top surface of the first gate electrode is aligned with the surface of the insulating layer.

20. The method for manufacturing a semiconductor device according to claim 18, wherein the second channel formation region is formed over the surface of the insulating layer.

21. The method for manufacturing a semiconductor device according to claim 18, wherein the semiconductor device is incorporated in one selected from the group consisting of a computer, a personal digital assistance, an electronic book, a mobile phone, a camera and a television device.

* * * * *